(12) United States Patent
Jung et al.

(10) Patent No.: US 7,898,880 B2
(45) Date of Patent: Mar. 1, 2011

(54) DUAL PORT MEMORY DEVICE, MEMORY DEVICE AND METHOD OF OPERATING THE DUAL PORT MEMORY DEVICE

(75) Inventors: Yu-Hwan Jung, Seoul (KR); Ji-Tae Ha, Seoul (KR); Chang-Hyuk Hui, Seoul (KR); Young-Hun Lim, Anyang (KR)

(73) Assignee: Mtekvision Co., Ltd., Seoul (KR)

( * ) Notice: Subject to any disclaimer, the term of this patent is extended or adjusted under 35 U.S.C. 154(b) by 97 days.

(21) Appl. No.: 12/438,428

(22) PCT Filed: Sep. 12, 2007

(86) PCT No.: PCT/KR2007/004415

§ 371 (c)(1),
(2), (4) Date: Feb. 23, 2009

(87) PCT Pub. No.: WO2008/032987

PCT Pub. Date: Mar. 20, 2008

(65) Prior Publication Data

US 2010/0232238 A1  Sep. 16, 2010

(30) Foreign Application Priority Data

| Sep. 12, 2006 | (KR) | ...................... 10-2006-0088100 |
| Sep. 12, 2006 | (KR) | ...................... 10-2006-0088107 |
| Sep. 25, 2006 | (KR) | ...................... 10-2006-0092696 |

(51) Int. Cl.
*G11C 7/00* (2006.01)

(52) U.S. Cl. ...................................... 365/191; 365/205

(58) Field of Classification Search .................. 365/191, 365/205
See application file for complete search history.

(56) References Cited

U.S. PATENT DOCUMENTS

| 5,289,426 | A | 2/1994 | Namimoto et al. |
| 5,701,267 | A | 12/1997 | Masuda et al. |
| 6,181,634 | B1 | 1/2001 | Okita |
| 6,594,720 | B1 * | 7/2003 | Matsui et al. ............... 710/301 |
| 2002/0136081 | A1 * | 9/2002 | Maesako et al. ............ 365/233 |
| 2003/0163624 | A1 * | 8/2003 | Matsui et al. ............... 710/301 |
| 2005/0114613 | A1 * | 5/2005 | Otani et al. ................. 711/154 |
| 2006/0053246 | A1 * | 3/2006 | Lee ........................... 711/100 |

FOREIGN PATENT DOCUMENTS

KR  10-2001-0039338 A  5/2001

* cited by examiner

*Primary Examiner*—Michael T Tran
(74) *Attorney, Agent, or Firm*—Birch, Stewart, Kolasch & Birch, LLP

(57) ABSTRACT

A dual port memory device converts an address and a control signal, which are inputted via a first port and conform to a first type memory interface, into an address and a control signal which conform to a second type memory interface, to access a memory array. The dual port memory device accesses a memory array based on an address and a control signal which are inputted via a second port and conform to the second type memory interface. The dual port memory device accesses a memory array according to the first type memory interface or the second type memory interface in response to a selecting signal. Therefore, the dual port memory device can be coupled to a processor with a first interface (e.g., PSRAM or SRAM interface) and a processor with a second interface (e.g., SDRAM interface).

25 Claims, 21 Drawing Sheets

DUAL PORT MEMORY DEVICE, MEMORY DEVICE AND METHOD OF OPERATING THE DUAL PORT MEMORY DEVICE

TECHNICAL FIELD

Example embodiments of the present invention relate to dual port memory devices, and more particularly to dual port memory devices, memory devices, and methods for operating a dual port memory device.

BACKGROUND ART

Processors such as a baseband processor, a video processor, and a multimedia processor which are used in a portable communication terminal like a cellular phone have a static random access memory (SRAM) external interface (or pseudo SRAM (PSRAM) external interface) and a synchronous dynamic random access memory (SDRAM) external interface.

A dual port memory is usually used in processors with the SRAM external interface (or PSRAM external interface) and the SDRAM external interface.

A dual port memory has two I/O ports and accesses data through the two ports such that a first processor accesses data through a first port and a second processor accesses data through a second port.

A case of using a dual port memory is faster in data transmission rate and more excellent in system performance than a case where two processors are coupled to different memories to exchange data via an external printed circuit board (PCB) line by a host processor interface. Using a dual port memory, there is an effect of reducing one memory in terms of the mounting area size.

FIGS. 1 and 2 are schematic diagrams illustrating dual port memories used by

FIGS. 1 and 2 are schematic diagrams illustrating dual port memories used by two processors which access memories with the same kind of memory cell structure. In detail, FIG. 1 is a schematic diagram illustrating a dual port memory used by a processor A with an SDRAM external bus interface (EBI) and a processor B with an SDRAM external bus interface (EBI) according to a conventional art, and FIG. 2 is a schematic diagram illustrating a dual port memory used by a processor A with an SRAM external bus interface (EBI) and a processor B with an SRAM external bus interface (EBI) according to the conventional art. Here, the external bus interface (EBI) serves as a sort of a memory controller.

As shown in FIGS. 1 and 2, a dual port memory with two ports may be used by the two processors which access a memory with the same kind of memory cell structure. That is, in case of FIG. 1, a dual port memory in which a memory cell array includes a DRAM is coupled to the two processors with the SDRAM external bus interface (EBI). Also, in case of FIG. 2, a dual port memory in which a memory cell array includes a SRAM is coupled to the two processors with the SRAM external bus interface (EBI).

However, such a dual port memory is difficult to be used between two processors with external bus interfaces (EBI) for different kinds of memories since unit memory cell structures are different.

An SDRAM is a volatile memory and stores data by periodically performing a refresh operation to periodically fill charges into a capacitor. Such an SDRAM has a unit memory cell structure of a DRAM comprised of one transistor and one capacitor.

An SRAM is a volatile memory in which data are erased when powered off, and it can maintain data stored in a memory cell while powered on even though a refresh operation is not performed. A unit memory cell of an SRAM has a structure comprised of four transistors with a latch structure and two transistors with a transmission gate structure, i.e., total six transistors. Since data are stored in a unit memory cell of a latch structure, a refresh operation for preserving data is not required. A unit memory cell of an SRAM is realized by six transistors, and so it has a disadvantage in the layout area size, compared to a unit memory cell of a DRAM comprised of one transistor and one capacitor.

A PSRAM uses the same interface as an SRAM, but it has a unit memory cell structure of a DRAM comprised of one transistor and one capacitor and has a refresh circuit built therein.

It is difficult to form both an SRAM memory cell and a DRAM memory cell which have different memory cell structures on a memory cell array region of a dual port memory due to restrictions in a semiconductor memory manufacturing process.

That is, in case where a processor A has an SRAM external bus interface (EBI) and a processor B has an SDRAM external bus interface (EBI), it is difficult to manufacture a dual port memory in which both an SRAM memory cell and a DRAM memory cell are formed on a memory cell array region due to restrictions in a semiconductor memory manufacturing process.

When both an SRAM memory cell and a DRAM memory cell are formed on a memory cell array region of a dual port memory, a manufacturing cost is increased because the size of a die is increased due to an SRAM memory cell comprised of six transistors.

For these reasons, a memory cell array of a conventional dual port memory is realized by one kind of memory cell structure of either an SRAM or a DRAM. In this instance, using a DRAM as a memory cell array of a dual port memory is more efficient in layout area size than using an SRAM.

A portable communication terminal gradually demands more processors, and to this end, a dual port memory is required which can be used between processors which have different memory interfaces.

Particularly, in a portable communication terminal like a cellular phone, required is a dual port memory with a DRAM memory cell structure which can be used by a processor with an SRAM external interface (or PSRAM external interface) and a processor with an SDRAM external interface.

A conventional dual port memory has a fixed memory interface logic so that a first port is used for data access from a processor with an SDRAM external interface and a second port is used for data access from either a processor with an SDRAM external interface or a processor with a PSRAM external interface.

Therefore, in the conventional dual port memory in which the first port is coupled to the processor with the SDRAM external interface and the second port is coupled to the processor the SDRAM external interface, the second port can not be coupled to a processor with a PSRAM (or SRAM) external interface.

That is, the conventional dual port memory has a disadvantage in that it can not be coupled to either a processor with an SDRAM external interface or a processor with a PSRAM (or SRAM) external interface according to its need.

For this reason, the conventional dual port memory can not satisfy demand of a portable communication terminal which requires gradually more processors because there is a restriction to accessible processors.

DISCLOSURE

Technical Problem

Accordingly, the present invention is provided to substantially obviate one or more problems due to limitations and disadvantages of the related art.

It is a first feature of the present invention to provide a dual port memory device which can be used by processors with different kinds of memory interfaces.

It is a second feature of the present invention to provide a memory device which can be used by processors with different kinds of memory interfaces.

It is a third feature of the present invention to provide a method of operating a dual port memory which can be used by processors with different kinds of memory interfaces.

Technical Solution

One aspect of the present invention to achieve the first feature of the present invention provides a dual port memory device, comprising: a memory array; a converting unit for converting an address and a control signal, which are inputted via a first port and conform to a first type memory interface, into an address and a control signal which conform to a second type memory interface; a first memory interface for performing a read operation or a write operation for the memory array based on the address and the control signal which conform to the second type memory interface; and a second memory interface for performing a read operation or a write operation on the memory array based on an address and a control signal which are inputted via a second port and conform to the second type memory interface. The converting unit may divide an address, which is inputted via the first port and conform to the first type memory interface, into a row address, a column address and a bank address which conform to the second type memory interface. The converting unit may include: a row address extractor for extracting a row address which conform to the second type memory interface from an address which is inputted via the first port and conform to the first type memory interface; a column address extractor for extracting a column address which conform to the second type memory interface from an address which is inputted via the first port and conform to the first type memory interface; and a bank address extractor for extracting a bank address which conform to the second type memory interface from an address which is inputted via the first port and conform to the first type memory interface. The converting unit may further include: a converter for receiving a control signal which is inputted via the first port and conform to the first type memory interface and generating timing information for performing a read operation, a write operation and a refresh operation which conform to the second type memory interface; and a command controller for receiving the timing information and generating a control signal for performing a read operation, a write operation and a refresh operation which conform to the second type memory interface. The memory array may have DRAM cell structure. The converting unit may convert the address and the control signal which are inputted via the first port and conform to the first type memory interface into the address and the control signal which conform to the second type memory interface through a signal converting path in response to a selecting signal or bypasses the address and the control signal which are inputted via the first port and conform to the second type memory interface through a bypass path. The converting unit may include: a first selector for providing the address and the control signal which are inputted via the first port and conform to the first type memory interface to the signal converting path or providing the address and the control signal which are inputted via the first port and conform to the second type memory interface to the bypass path; a signal converter for converting an address and a control signal which are provided to the signal converting path and conform to the first type memory interface into the address and the control signal which conform to the second type memory interface; and a second selector for selecting an address and a control signal which are bypassed or an address and a control signal which are outputted from the signal converter and conform to the second type memory interface. The first type memory interface may include a PSRAM interface, the second type memory interface may include an SDRAM interface, and the signal converter may divide an address, which is provided to the signal converting path and conform to the first type memory interface, into a row address, a column address and a bank address which conform to the second type memory interface.

One aspect of the present invention to achieve the first feature of the present invention provides a dual port memory device, comprising: a memory array; a dual interface port for accessing the memory array according to a first type memory interface or a second type memory interface based on an address and a control signal which are inputted via a first port, in response to a selecting signal; and a first memory interface for accessing the memory array through the second type memory interface based on an address and a control signal which are inputted via a second port. The dual interface may include: a first selector for providing a first path through which the memory array is accessed according to the first type memory interface based on an address and a control signal which are inputted via the first port or a second path through which the memory array is accessed according to the second type memory interface, in response to the selecting signal; an interface for outputting an address for accessing the memory array and data according to the first type memory interface based on an address and a control signal which are provided through the first path or outputting an address for accessing the memory array and data according to the second type memory interface based on an address and a control signal which are provided through the second path; and a second selector for selecting any of an address for accessing the memory array and data according to the first type memory interface and an address for accessing the memory array and data according to the second type memory interface and a control signal in response to the selecting signal. The interface may include: an I/O buffer coupled between the first selector and the second selector and configured to buffer data to access the memory array; a first type memory interface for buffering data to access the memory array in the I/O buffer according to the first type memory interface based on an address and a control signal which are provided through the first path, and decoding and outputting an address which is provided through the first path; and a second type memory interface for buffering data to access the memory array in the I/O buffer according to the second type memory interface based on an address and a control signal which are provided through the second path, and decoding and outputting an address which is provided through the second path.

One aspect of the present invention to achieve the second feature of the present invention provides a memory device, comprising: a memory array; a converting unit for converting an address and a control signal which are inputted via a first port and conform to a first type memory interface into an address and a control signal which conform to a second type memory interface; and a memory interface for performing a read operation or a write operation on the memory array based on the address and the control signal which conform to the second type memory interface. The first type memory interface may be a PSRAM interface, and the second type memory interface may be an SDRAM interface. The converting unit may divide the address, which is inputted via the first port and conform to the first type memory interface, into a row address, a column address and a bank address which conform to the second type memory interface. The converting unit may convert the address and the control signal which are inputted via the first port and conform to the first type memory interface into the address and the control signal which conform to the second type memory interface through a signal converting path in response to a selecting signal or bypasses an address and a control signal which are inputted via the first port and conform to the second type memory interface through a bypass path. The converting unit may include: a first selector for providing the address and the control signal, which are inputted via the first port and conform to the first type memory interface, to the signal converting path or providing an address and a control signal which are inputted via the first port and conform to the second type memory interface to the bypass path; a signal converter for converting an address and a control signal, which are provided to the signal converting path and conform to the first type memory interface, into an address and a control signal which conform to the second type memory interface; and a second selector for selecting an address and a control signal which are bypassed or an address and a control signal which are outputted from the signal converter and conform to the second type memory interface.

Another aspect of the present invention to achieve the second feature of the present invention provides a memory device, comprising: a memory array; and a dual interface port for accessing the memory array according to a first type memory interface or a second type memory interface based on an address and a control signal which are inputted via a first port, in response to a selecting signal. The dual interface may include: a first selector for providing a first path through which the memory array is accessed according to the first type memory interface based on an address and a control signal which are inputted via the first port or a second path through which the memory array is accessed according to the second type memory interface, in response to the selecting signal; an interface for outputting an address for accessing the memory array and data according to the first type memory interface based on an address and a control signal which are provided through the first path or outputting an address for accessing the memory array and data according to the second type memory interface based on an address and a control signal which are provided through the second path; and a second selector for selecting any address of an address for accessing the memory array and data according to the first type memory interface and an address for accessing the memory array and data according to the second type memory interface and data in response to the selecting signal.

One aspect of the present invention to achieve the third feature of the present invention provides a method of operating a dual port memory device, comprising: converting an address and a control signal, which are inputted via a first port and conform to a first type memory interface, into an address and a control signal which conform to a second type memory interface; and performing a read operation or a write operation on the memory array based on the address and the control signal which conform to the second type memory interface. The converting an address and a control signal, which are inputted via a first port and conform to a first type memory interface, into an address and a control signal which conform to a second type memory interface may include dividing an address, which is inputted via the first port and conform to the first type memory interface, into a row address, a column address and a bank address which conform to the second type memory interface. The converting an address and a control signal, which are inputted via a first port and conform to a first type memory interface, into an address and a control signal which conform to a second type memory interface may include: extracting a row address which conform to the second type memory interface from an address which is inputted via the first port and conform to the first type memory interface; extracting a column address which conform to the second type memory interface from an address which is inputted via the first port and conform to the first type memory interface; and extracting a bank address which conform to the second type memory interface from an address which is inputted via the first port and conform to the first type memory interface. The converting an address and a control signal, which are inputted via a first port and conform to a first type memory interface, into an address and a control signal which conform to a second type memory interface may include: receiving a control signal which is inputted via the first port and conform to the first type memory interface and generating timing information for performing a read operation, a write operation and a refresh operation which conform to the second type memory interface; and receiving the timing information and generating a control signal which conform to the second type memory interface. The converting an address and a control signal, which are inputted via a first port and conform to a first type memory interface, into an address and a control signal which conform to a second type memory interface may include: converting the address and the control signal, which are inputted via the first port and conform to the first type memory interface, into an address and a control signal which conform to the second type memory interface through a signal converting path in response to a selecting signal or bypassing an address and a control signal which are inputted via the first port and conform to the second type memory interface through a bypass path; performing a read operation or a write operation on the memory array based on the converted address and control signal while the selecting signal has a non-active state; and performing a read operation or a write operation on the memory array based on the bypassed address and control signal while the selecting signal has an active state. The converting an address and a control signal, which are inputted via the first port and conform to the first type memory interface, into an address and a control signal which conform to the second type memory interface through a signal converting path in response to a selecting signal or bypassing an address and a control signal which are inputted via the first port and conform to the second type memory interface through a bypass path may include: bypassing an address and a control signal, which are inputted via the first port and conform to the second type memory interface, through the bypass path when the selecting signal gets active; converting an address and a control signal, which are inputted via the first port and conform to the second type memory interface, into an address and a control signal which conform to the second type memory interface through a signal converting path when the selecting signal gets non-active; converting an address and a control signal, which are provided to the signal converting path and conform to the first type memory interface, into an address and a control signal which conform to the second type memory interface; and selecting an address and a control signal which are bypassed or an address and a control signal which are outputted from a signal converter and conform to the second type memory interface. The first type memory interface may include a PSRAM interface, the second type memory interface may include an SDRAM interface, and the converting an address and a control signal, which are provided to the signal converting path and conform to the first type memory interface, into an address and a control signal which conform to the second type memory interface may include dividing an address, which is provided to the signal converting path and conform to the first type memory interface, into a row address, a column address and a bank address which conform to the second type memory interface. The converting an address and a control signal, which are provided to the signal converting path and conform to the first type memory interface, into an address and a control signal which conform to the second type memory interface may include: extracting a row address, which conform to the second type memory interface, from an address which is inputted to the signal converting path and conform to the first type memory interface; extracting a column address, which conform to the second type memory interface, from an address which is inputted to the signal converting path and conform to the first type memory interface; and extracting a bank address, which conform to the second type memory interface, from an address which is inputted to the signal converting path and conform to the first type memory interface. The converting an address and a control signal, which are provided to the signal converting path and conform to the first type memory interface, into an address and a control signal which conform to the second type memory interface may include: receiving a control signal which is inputted to the signal converting path and conform to the first type memory interface and generating timing information for performing a read operation, a write operation and a refresh operation which conform to the second type memory interface; and receiving the timing information and generating a control signal which conform to the second type memory interface.

Another aspect of the present invention to achieve the third feature of the present invention provides a method of operating a dual port memory device, comprising: accessing a memory array according to a first type memory interface based on an address and a control signal which are inputted via a first port while a selecting signal has a non-active state; and accessing a memory array according to a second type memory interface based on an address and a control signal which are inputted via the first port while the selecting signal has an active state. The method may further include: providing a first path through which the memory array is accessed according to the first type memory interface based on an address and a control signal which are inputted via the first port while the selecting signal has the non active state; and providing a second path through which the memory array is accessed according to the second type memory interface while the selecting signal has the non active state. The accessing a memory array according to a first type memory interface based on an address and a control signal which are inputted via a first port while the selecting signal has a non-active state may include outputting an address for accessing the memory array and data according to the first type memory interface based on an address and a control signal which are provided through the first path. The accessing a memory array according to a second type memory interface based on an address and a control signal which are inputted via the first port while the selecting signal has an active state may include outputting an address for accessing the memory array and data according to the second type memory interface based on an address and a control signal which are provided through the second path. The method may further include selecting any of an address for accessing the memory array according to the first type memory interface and an address for accessing the memory array according to the second type memory interface in response to the selecting signal.

BRIEF DESCRIPTION OF DRAWINGS

Example embodiments of the present invention will become more apparent by describing in detail example embodiments of the present invention with reference to the accompanying drawings, in which.

BEST MODE FOR CARRYING OUT THE INVENTION

Figure 1:
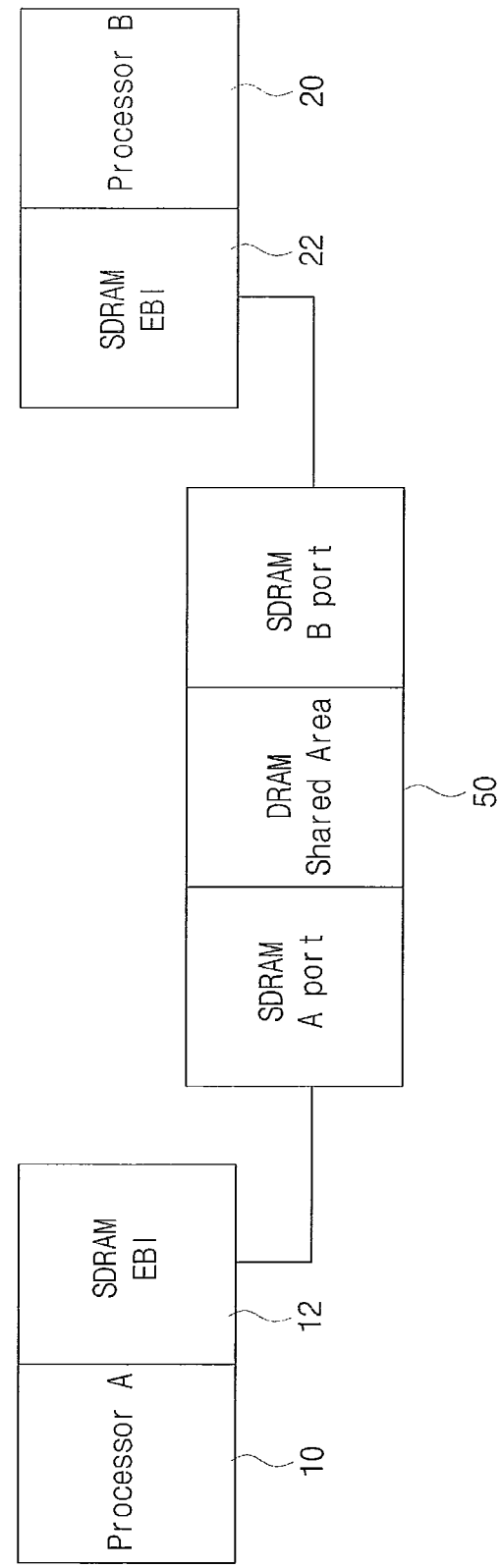
FIG. 1 is a schematic diagram illustrating a dual port memory used by a processor A with an SDRAM external bus interface (EBI) and a processor B with an SDRAM external bus interface (EBI) according to a conventional art.
Figure 2:
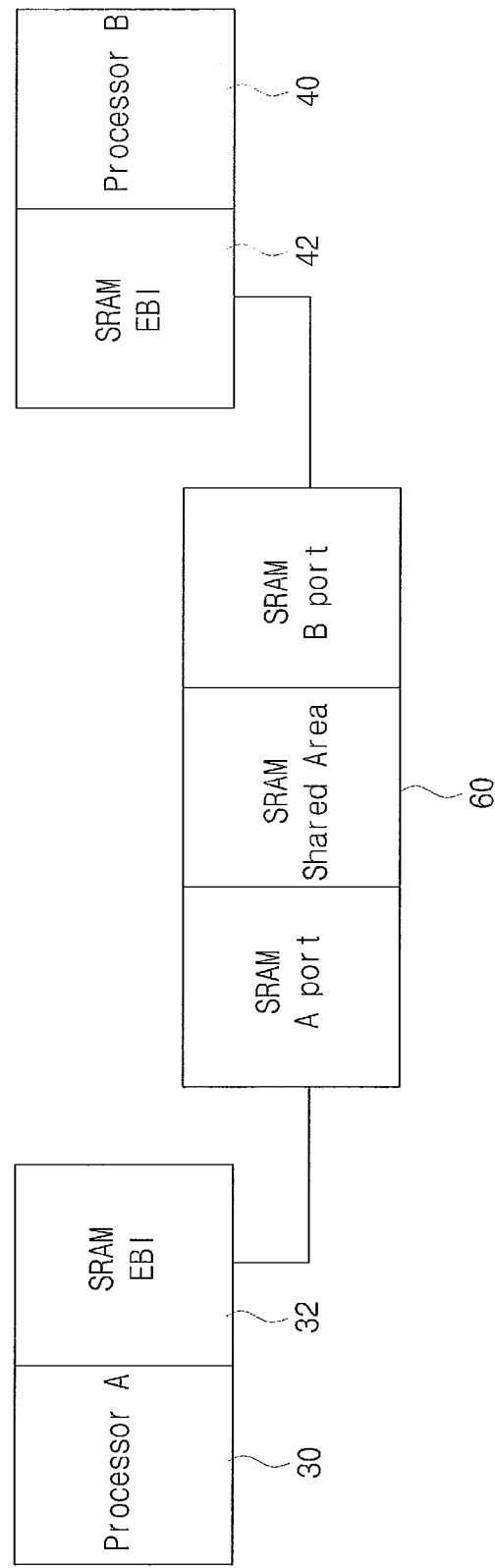
FIG. 2 is a schematic diagram illustrating a dual port memory used by a processor A with an SRAM external bus interface (EBI) and a processor B with an SRAM external bus interface (EBI) according to the conventional art.

While the invention is susceptible to various modifications and alternative forms, specific embodiments thereof are shown by way of example in the drawings and will herein be described in detail. However, it should be understood that there is no intent to limit the invention to the particular forms disclosed, but on the contrary, the invention is to cover all modifications, equivalents, and alternatives falling within the spirit and scope of the invention. In the drawings, like reference numerals denote like parts.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

In the drawings, like reference numerals denote like parts.

Hereinafter, exemplary embodiments of the present invention will be described in more detail with reference to the accompanying drawings. In the following description, elements having the same functions as those of the elements which have been previously described will be indicated with the same reference numerals, and a detailed description thereof will be omitted.

Figure 3:
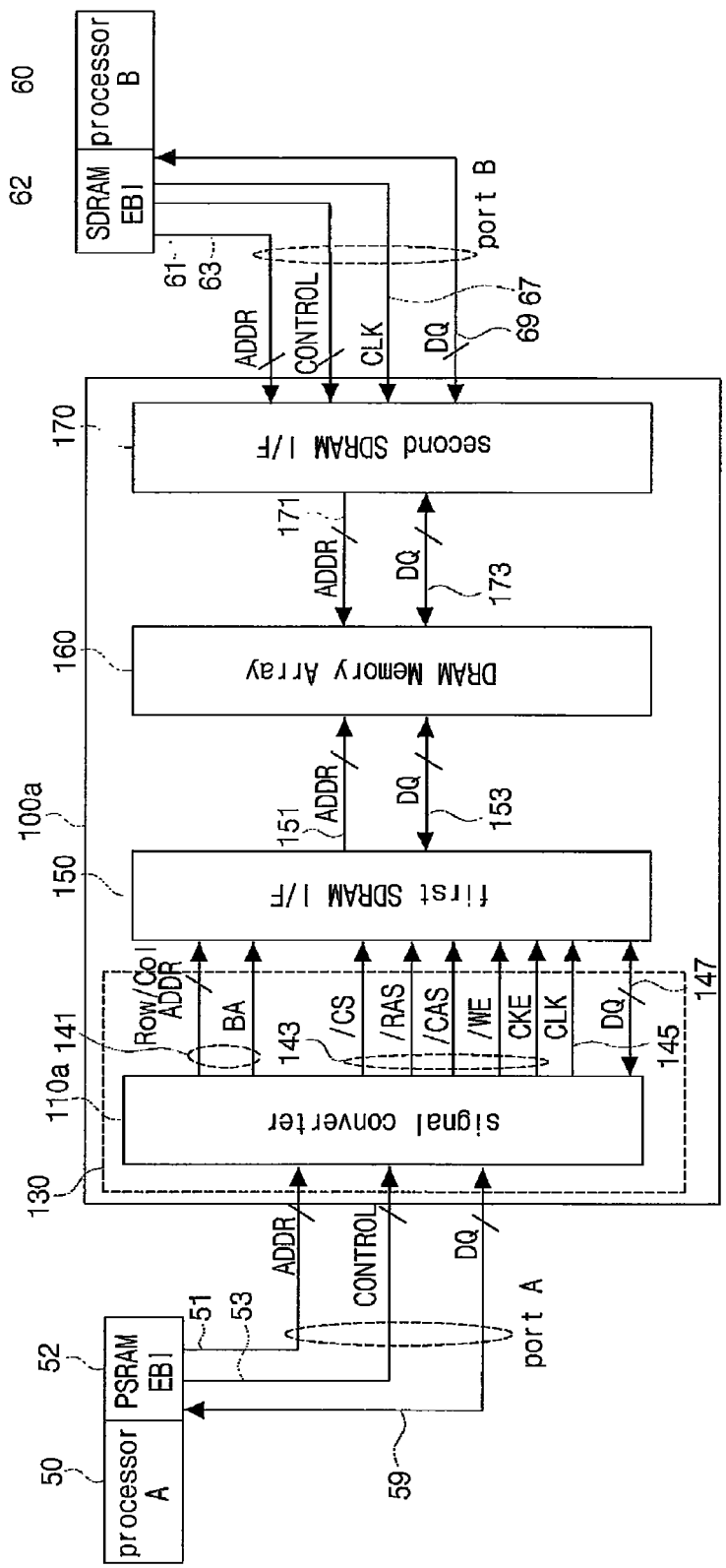
FIG. 3 is a block diagram illustrating a dual port SDRAM which is connected to a processor with a PSRAM (or SRAM) external interface bus and a processor with an SDRAM external interface bus according to a first exemplary embodiment of the present invention.
Figure 4:
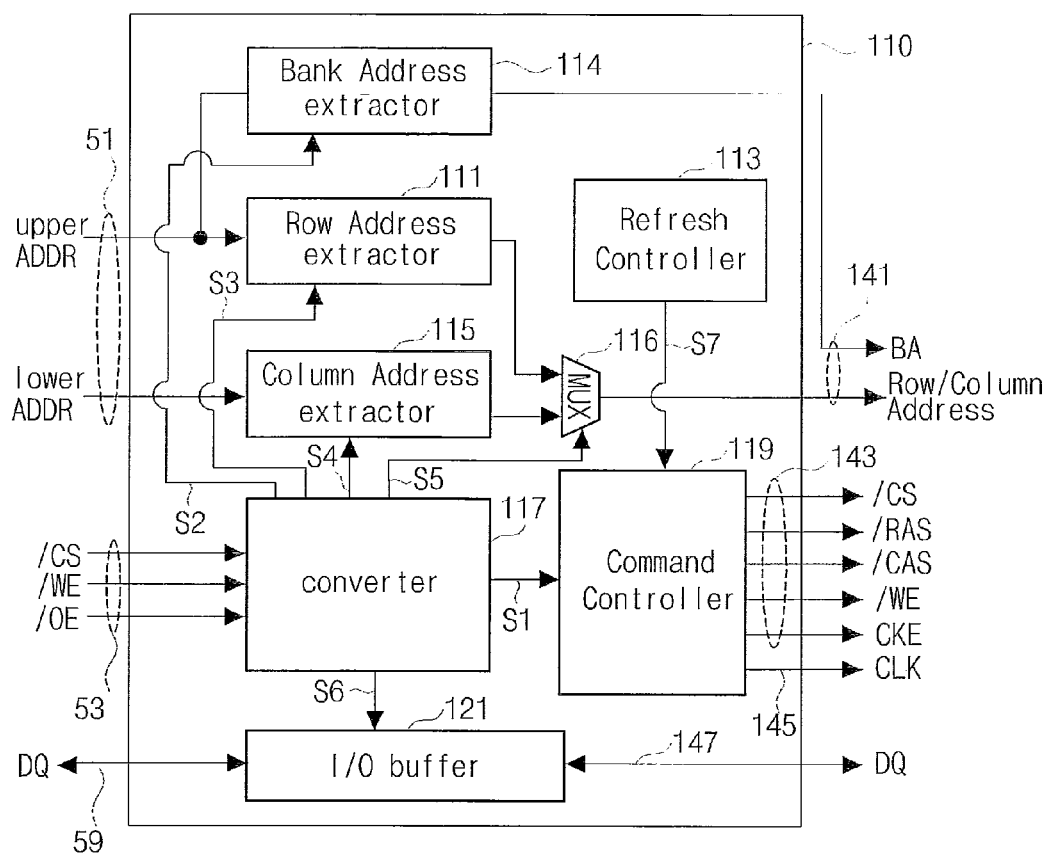
FIG. 4 is a block diagram illustrating a converting unit of the dual port SDRAM of FIG. 3.

FIG. 3 is a block diagram illustrating a dual port SDRAM which is coupled to a processor with a PSRAM (or SRAM) external interface bus and a processor with an SDRAM external interface bus according to a first exemplary embodiment of the present invention. FIG. 4 is a block diagram illustrating a converting unit of the dual port SDRAM of FIG. 3. The dual port SDRAM 100 has a unit memory cell structure of a DRAM.

The dual port SDRAM 100 is coupled to a processor A 50 with a PSRAM (or SRAM) external interface bus (EBI) 52 via a port A. The dual port SDRAM 100 converts an address 51, a control signal 53 and data 59 into an address 141, a control signal 143, a clock 45, and data 147 which follow an operation timing of an SDRAM and then accesses an SDRAM memory array 160 via a first SDRAM interface 150.

The control signal 53 may include a chip select signal /CS, a write enable signal /WE, and an output enable signal /OE which follow an operation timing of a PSRAM (or SRAM). The control signal 143 may include a chip select signal /CS, a row address strobe signal /RAS, a column address strobe signal /CAS, and a write enable signal /WE which are used to perform a read operation, a write operation and a refresh operation of an SDRAM.

The dual port SDRAM 100 exchanges data with a processor B 60 with an SDRAM external interface (EBI) 62 via a port B. The processor B 60 with the SDRAM external interface bus 62 outputs an address 61 and a plurality of control signals 63 to a plurality of address pins, a plurality of control signal pins and a plurality of data pins of the dual port SDRAM 100, and the dual port SDRAM 100 uses a second SDRAM interface 170 to receive or output data via the port B.

Referring to FIG. 3, the dual port SDRAM 100 according to one exemplary embodiment of the present invention includes a converting unit 130, a first SDRAM interface 150, a DRAM memory array 160, and a second SDRAM interface 170.

The converting unit 130 may include a signal converter 110.

The signal converter 110 receives the address 51 and a plurality of control signals 53 from and exchanges data 59 with the processor A 50 with the PSRAM (or SRAM) external interface bus 52 through a plurality of address pins, a plurality of control signal pins and a plurality of data pins.

The signal converter 110 converts the control signals which conform to the PSRAM (or SRAM) interface into the control signals 143 which conform to the SDRAM interface. In more detail, the signal converter 110 receives the control signals 53 such as /CS, /WE and /OE which follow the operation timing of the PSRAM (or SRAM) to generate the control signals 143 such as /CS, /RAS, /CAS, and /WE which are used to perform the read operation, the write operation and the refresh operation of the SDRAM. The signal converter 110 generates the clock signal 145 necessary for operating the SDRAM.

The signal converter 110 receives, for example, an N-bit address 51 from the processor A 50 with the PSRAM (or SRAM) external interface and converts the N-bit address 51 into the address 141 which conform to an address system of the SDRAM. For example, the addresses 141 may include a row address, a column address, and a bank address (BA). The bank address may include one bit when the DRAM memory array 160 has two banks or two bits when the DRAM memory array 160 has four banks. The SDRAM interface 150 of FIG. 3 may be arranged for each bank indicated by each bank address.

The signal converter 110 controls an input/output timing of data inputted from the processor A 50 with the PSRAM (or SRAM) external interface bus 52 or data read from the DRAM memory array 160 to follow the operating timing of the read operation, the write operation and the refresh operation.

The operation of the signal converter 110 is described below in more detail with reference to FIG. 4.

Referring to FIG. 4, the signal converter 110 includes a row address output extractor 111, a column address extractor 115, a refresh controller 113, a MUX 116, a converter 117, a command controller 119, and an I/O buffer 118. The signal converter 110 may further include a bank address extractor 114 when the DRAM memory array 160 includes a plurality of banks. Hereinafter, it is assumed that the DRAM memory array 160 includes a plurality of banks.

The bank address extractor 114 extracts the bank address (BA) from an upper address among the inputted address 51 based on a bank address control signal S2.

The row address extractor 111 extracts the row address from an upper address among the inputted address 51 based on a row address control signal S3. The column address extractor 115 extracts the column address from a lower address among the inputted address 51 based on a column address control signal S4. The MUX 116 sequentially outputs the row address and the column address based on a MUX control signal S5.

The refresh controller 113 generates a clock timing signal and provides the clock timing signal to the command controller 119. The command controller 119 generates a clock CLK 145 to be provided to the first SDRAM interface 150 based on the clock timing signal. Here, the refresh controller 113 may be configured to generate the clock CLK 145 to be provided directly to the first SDRAM interface 150. The refresh controller 113 may be realized by using an oscillator.

The converter 117 receives the control signals 53 which follow the operation timing of the PSRAM (or SRAM) such as /CS, /WE and /OE and provides timing information Si for performing the read operation, the write operation, and the refresh operation of the SDRAM to the command controller 119. The converter 117 generates the bank address control signal S2, the row address control signal S3, the column address control signal S4, the MUX control signal S5, and an I/O buffer control signal S6 which are respectively used to control the operation timing of the bank address extractor 114, the row address extractor 111, the column address extractor 115, the MUX 116, the command controller 119, and the I/O buffer 121 by using the control signals 53 which follows the operation timing of the PSRAM (or SRAM).

The command controller 119 receives the timing information Si generated by the converter 117 to generate the control signals 143 such as /CS, /RAS, /CAS, /WE, and CKE (clock enable signal) which are used to perform a row active operation, the read operation, the write operation, and the refresh operation of the SDRAM.

The command controller 119 generates the control signals 143 such as /CS, /RAS, /CAS, /WE, and CKE (clock enable signal) by controlling the operation timing so that the read/write operations do not collide with the refresh operation of the SDRAM.

/CS, /RAS, /CAS, and /WE with the controlled timing for performing the row active operation, the read operation, the write operation, and the refresh operation of the SDRAM are generated by using the control signals 53 which conform to the PSRAM interface such as /CS, /WE and /OE.

In more detail, while the refresh operation is not performed, when among the control signals 53 which conform to the PSRAM interface, /CS and /WE get active, the signal levels (high, low) of /CS, /RAS, /CAS, and /WE which conform to the SDRAM interface are controlled to perform the write operation. That is, when among the control signals 53 which conform to the PSRAM interface, /CS and /WE get active, in order to perform the write operation of the SDRAM, the CS, /WE, /RAS, and /CAS which conform to the SDRAM interface are generated with a low level, a high level, a low level, and a high level, respectively, to activate an active command, thereby triggering the row active operation for activating a row line corresponding to a predetermined row address of the SDRAM. Then, /CS, /WE, /RAS, and /CAS which conform to the SDRAM interface are generated with a low level, a low level, a high level, and a low level, respectively, to activate a write command, thereby triggering the write operation.

In more detail, while the refresh operation is not performed, when among the control signals 53 which conform to the PSRAM interface, /CS and /OE get active, the signal levels (high, low) of /CS, /RAS, /CAS, and /WE which conform to the SDRAM interface are controlled to perform the read operation. That is, when among the control signals 53 which conform to the PSRAM interface, /CS and /OE get active, in order to perform the read operation of the SDRAM, the CS, /WE, /RAS, and /CAS which conform to the SDRAM interface are generated with a low level, a high level, a low level, and a high level, respectively, to activate the active command, thereby triggering the row active operation for activating a row line corresponding to a predetermined row address of the SDRAM. Then, /CS, /WE, /RAS, and /CAS which conform to the SDRAM interface are generated with a low level, a high level, a high level, and a low level, respectively, to activate a read command, thereby triggering the read operation.

FIG. 4 shows that the converter 117 and the command controller 119 are realized by two separate blocks, but the converter 117 and the command controller 119 may be realized by a single controller (Finite State Machine; FSM).

The I/O buffer 121 buffers the data 59 in an input buffer (not shown) under the control of the converter 117 and then outputs the data 59 to the first SDRAM interface 150 according to a write operation timing of the SDRAM, and buffers the data 147 in an output buffer (not shown) and then outputs the data 147 according to a read operation timing of the SDRAM.

Returning to FIG. 3, the first SDRAM interface 150 receives the address 141, the control signals 143, the clock 145, and the data 147 from the signal converter 110, decodes the address 141 into the row address and the column address and outputs the decoded address 151 to the DRAM memory array 160, and receives/outputs the data 153 from/to the DRAM memory 160 according to the operation timing of the read operation, the write operation, and the refresh operation of the SDRAM.

The first SDRAM interface 150 has a typical SDRAM interface configuration and includes a command decoder for receiving and decoding the control signals 143, a row decoder for decoding the row address, a column decoder for decoding the column address, a sense amplifier, and a refresh controller for controlling the refresh operation.

The second SDRAM interface 170 receives the address 61, the control signals 63, and a clock 67 from the processor B 60 with the SDRAM external interface bus 62 via the port B, decodes the address 61 into the row address and the column address and outputs the decoded address 171 to the DRAM memory array 160, and receives/outputs the data 173 from/to the DRAM memory 160 according to the operation timing of the read operation, the write operation, and the refresh operation of the SDRAM.

The second SDRAM interface 170 has a typical SDRAM interface configuration and includes a command decoder for receiving and decoding the control signals 163, a row decoder, a column decoder, a sense amplifier, and a refresh controller.

Therefore, since the signal converter 110 is arranged before the SDRAM interface 150 to generate the address and the control signals which conform to the SDRAM interface and provide the address and the control signals which conform to the SDRAM interface to the SDRAM interface 150, the SDRAM interface 150 of the typical dual port memory can be used "as is" without changing logic circuit thereof.

The memory with a dual port has been described with reference to FIG. 3, but the present invention can be applied to a memory device with a single port. For example, the present invention can be applied to a memory device comprised of the signal converter 110, the memory interface 150, and the memory array 160 in which the second memory interface 170 is removed from the dual port memory of FIG. 3.

Figure 5:
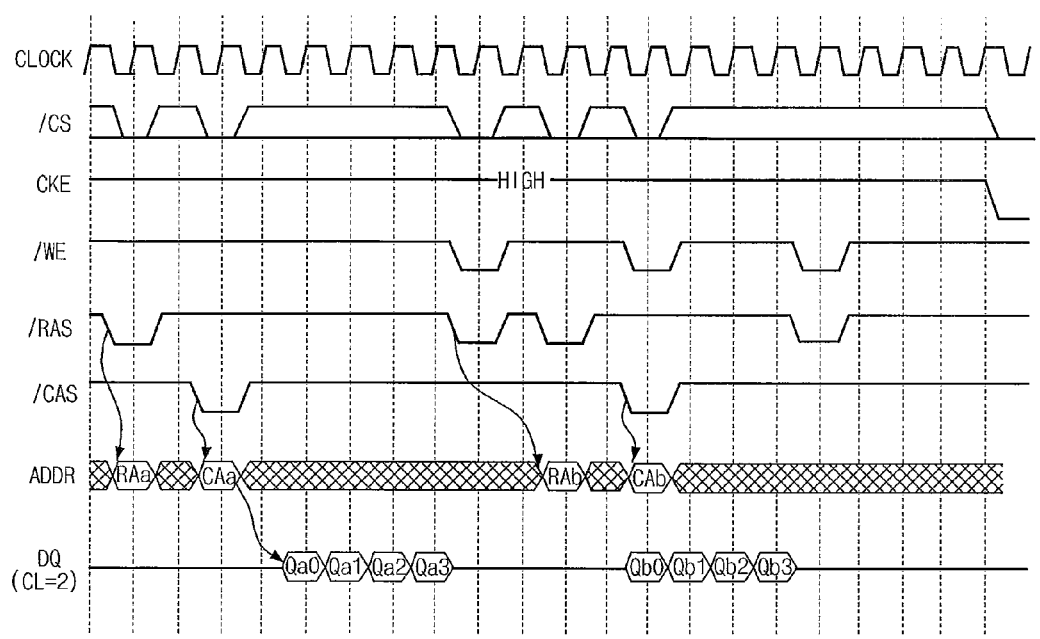
FIG. 5 is a timing diagram illustrating read and write operations of the dual port SDRAM according to the first exemplary embodiment of the present invention.

FIG. 5 is a timing diagram illustrating the read and write operations of the dual port SDRAM according to the first exemplary embodiment of the present invention. In FIG. 5, the clock signal CLK, /CS, /RAS, CAS, and /WE are signals generated by the command controller 119 of FIG. 4.

The dual port SDRAM 100 converts the address 51 and the control signals 53 such as /CS, /WE and /OE which conform to the PSDRAM (or SRAM) interface into the address 141 and the control signals 143 such as /CS, /RAS, /CAS, CKE, and /WE which conform to the SDRAM interface through the signal converter 110 to perform the read and write operations according to the read and write operation timings of the SDRAM.

Referring to FIG. 5, data are read out from or written into the dual port memory device, synchronized with the clock signal CLK. Since the dual port memory device is synchronized with the clock signal, the clock enable signal CKE has a high level. When all of /RAS, /CAS and /WE have a high level, No operation (NOP) state is maintained. When /CS has a high level, the command decoder is disabled, an input of /RAS, /CAS, /WE, and the address is ignored. FIG. 5 shows the read and write operations in the memory array corresponding to a bank indicated by the bank address.

First, the read operation is performed as follows. When /CS, /WE, /RAS, and /CAS have a low level, a high level, a low level, and a high level, respectively, a row address is applied to an address pin, so that a row line corresponding to the row address of the memory array 160 is activated ("row active"). When /CS, /WE, /RAS, and /CAS have a low level, a high level, a high level, and a low level, respectively, a read command is inputted to apply a column address to the address pin, so that data are read out through a column line corresponding to the column address of the memory array 160 when a predetermined delay time (CAS Latency) lapses after the read command is inputted. In FIG. 5, it is assumed that the CAS latency is 2 clocks.

Next, the write operation is performed as follows. When /CS, /WE, /RAS, and /CAS have a low level, a low level, a low level, and a high level, respectively, a row address is applied to the address pin, so that a row line corresponding to the row address of the memory array 160 is activated ("row active"). When /CS, /WE, /RAS, and /CAS have a low level, a low level, a high level, and a low level, respectively, a write command is inputted to apply a column address to the address pin, so that data are written through a column line corresponding to the column address of the memory array 160.

Figure 6:
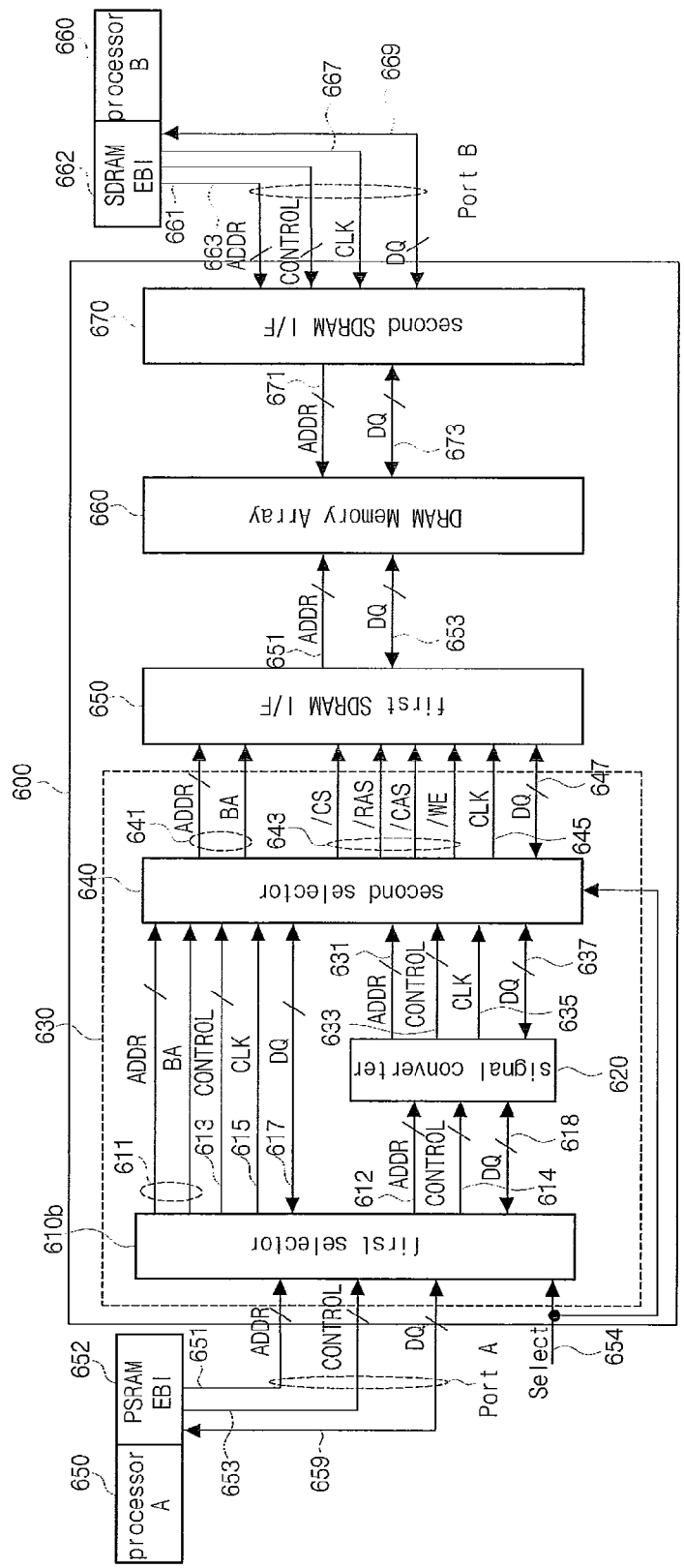
FIG. 6 is a block diagram illustrating a state that a dual port SDRAM according to a second exemplary embodiment of the present invention is coupled to a processor with a PSRAM external interface bus and a processor with an SDRAM external interface bus.
Figure 7:
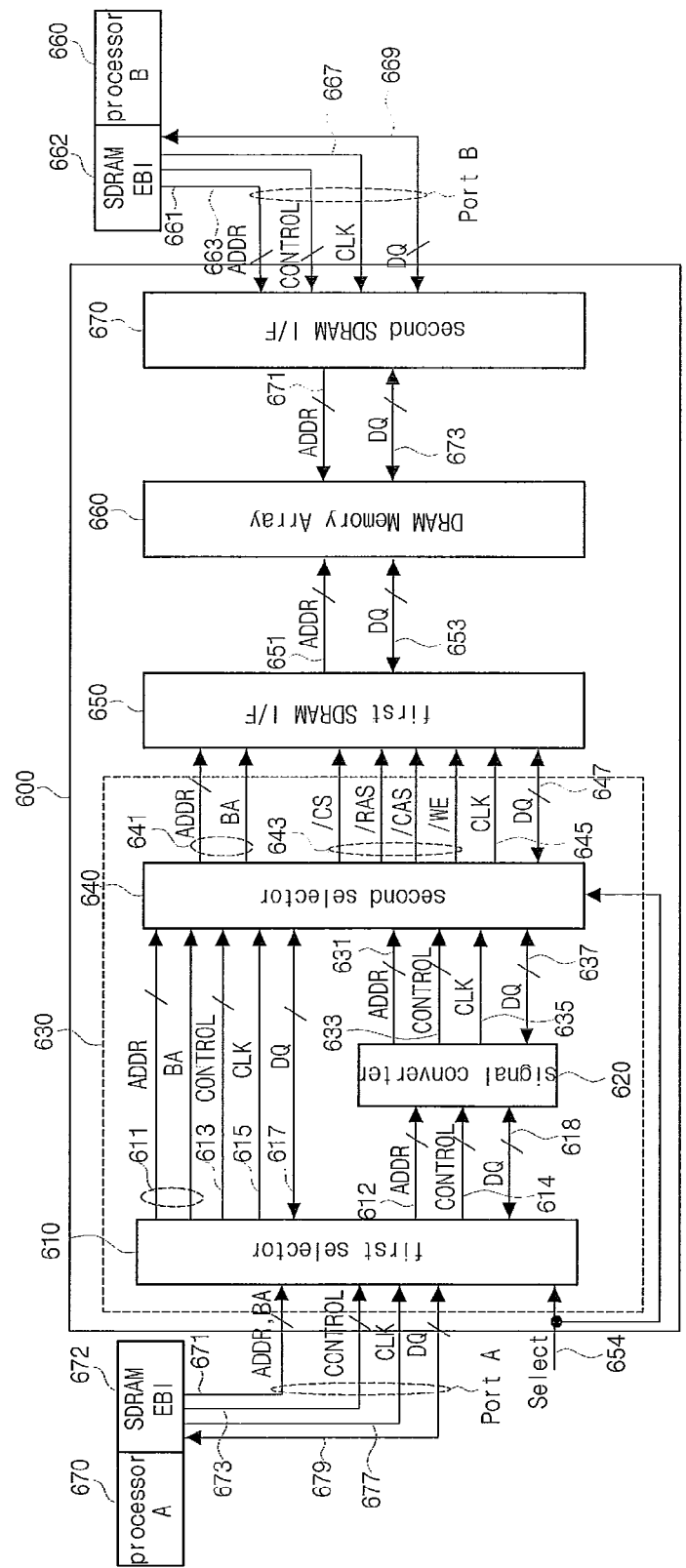
FIG. 7 is a block diagram illustrating a state that the dual port SDRAM according to the second exemplary embodiment of the present invention is coupled to two processors with an SDRAM external interface bus.
Figure 8:
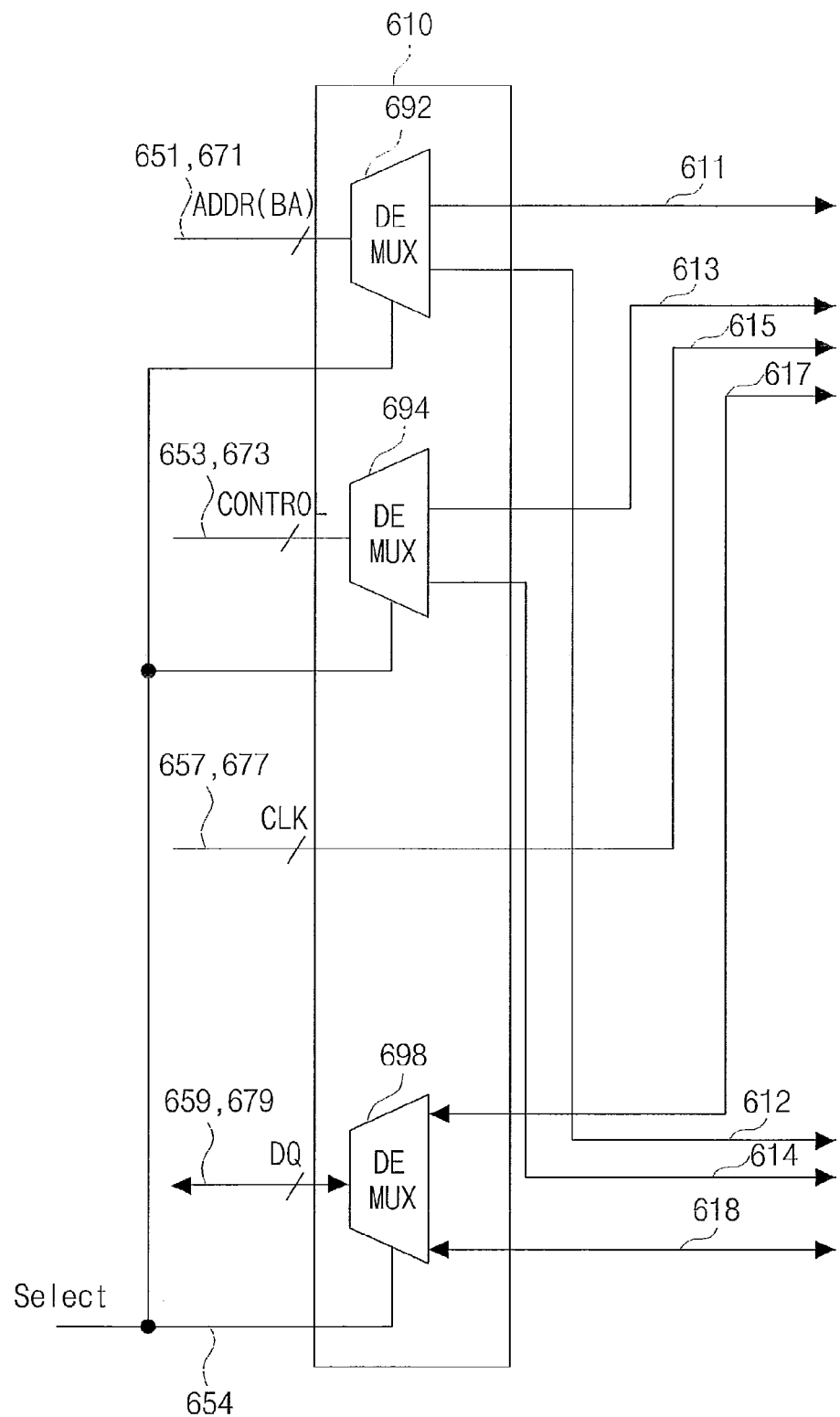
FIG. 8 is a block diagram illustrating a first selector of the dual port SDRAM of FIG. 6 or 7.
Figure 9:
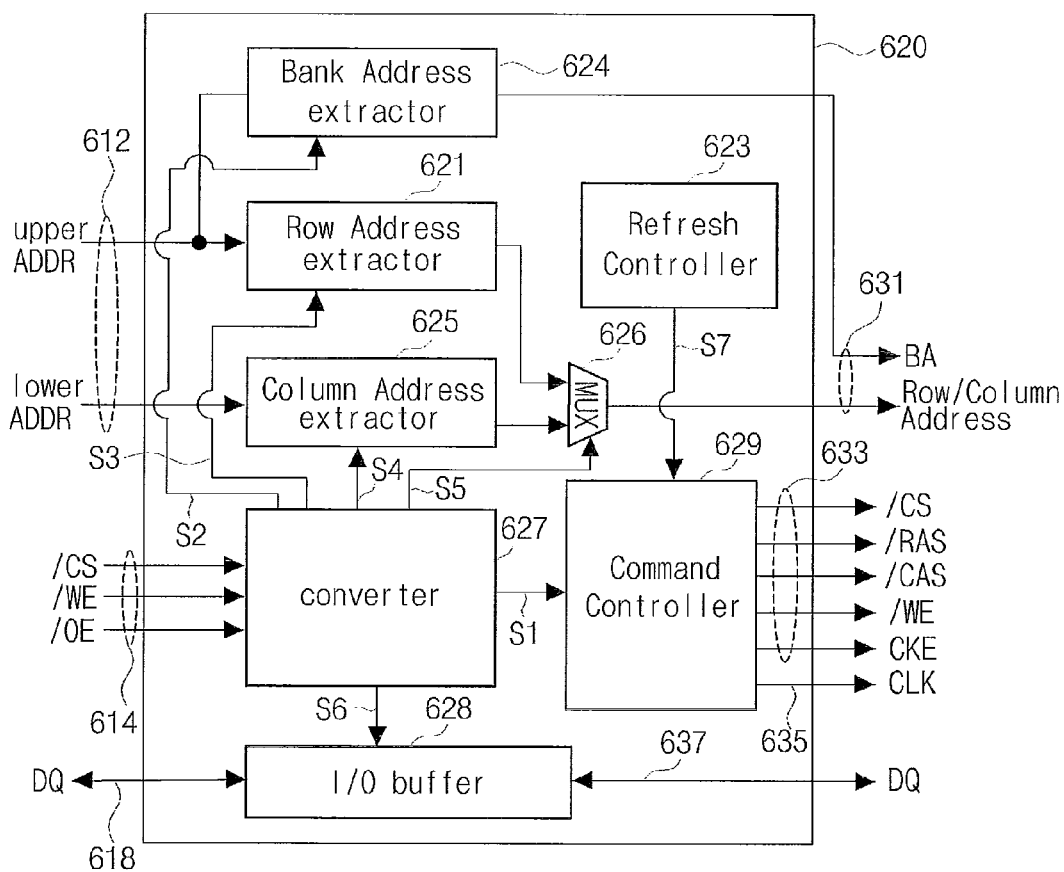
FIG. 9 is a block diagram illustrating a signal converter of the dual port SDRAM of FIG. 6 or 7.
Figure 10:
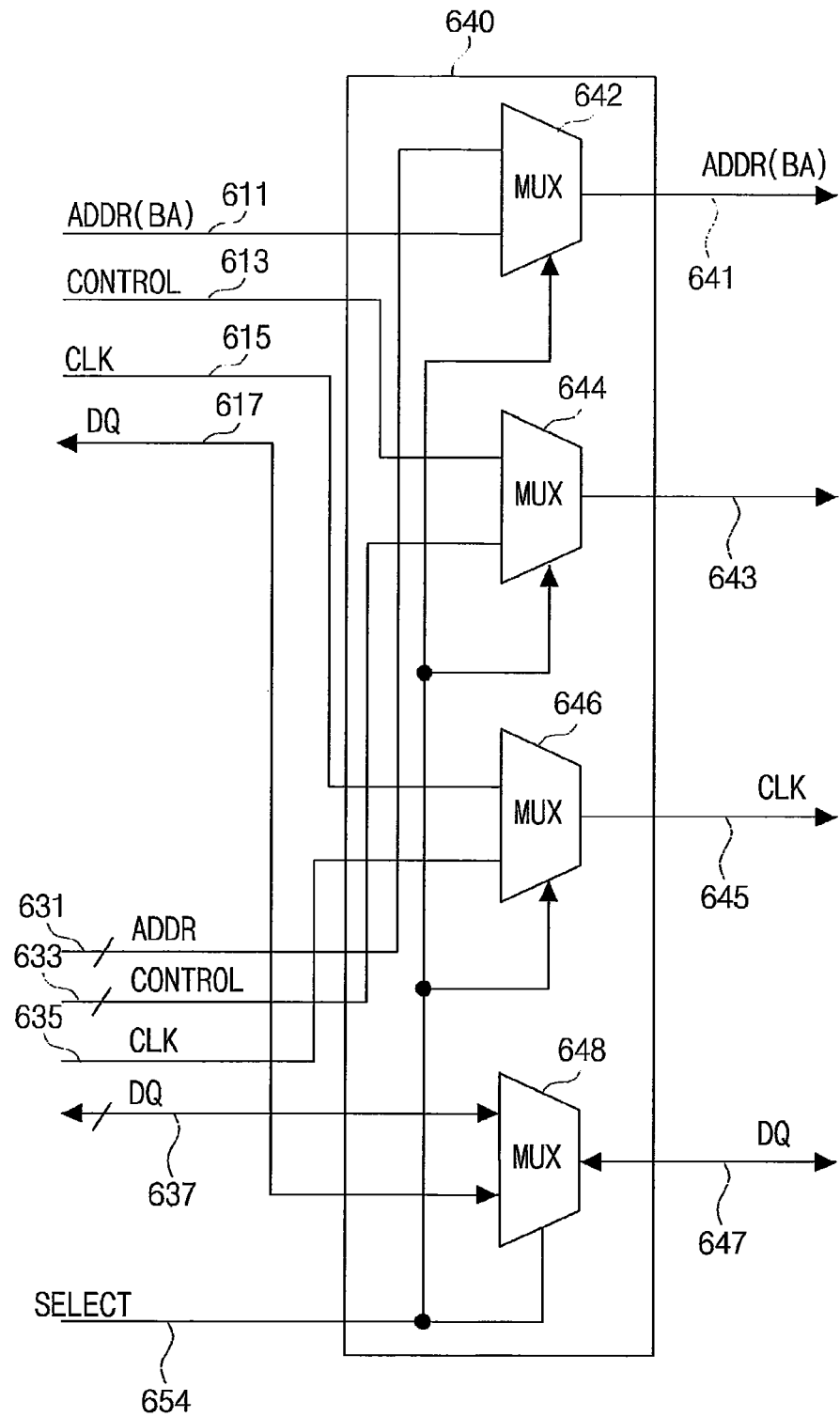
FIG. 10 is a second selector of the dual port SDRAM of FIG. 6 or 7.

FIG. 6 is a block diagram illustrating a state that a dual port SDRAM according to a second exemplary embodiment of the present invention is coupled to a processor with a PSRAM external interface bus and a processor with an SDRAM external interface bus. FIG. 7 is a block diagram illustrating a state that the dual port SDRAM according to the second exemplary embodiment of the present invention is coupled to two processors with an SDRAM external interface bus. FIG. 8 is a block diagram illustrating a first selector of the dual port SDRAM of FIG. 6 or 7, FIG. 9 is a block diagram illustrating a signal converter of the dual port SDRAM of FIG. 6 or 7, and FIG. 10 is a second selector of the dual port SDRAM of FIG. 6 or 7. The dual port SDRAM 600 has a unit memory cell structure of a DRAM.

The dual port SDRAM 600 of FIG. 6 operates in a PSRAM mode. When coupled to a processor A 650 with a PSRAM external interface bus (EBI) 652 via a port A, the dual port SDRAM 600 converts an address 651, control signals 653 and data 659 into an address 631, control signals 633, a clock 635, and data 637 which follow the operation timing of the SDRAM through a signal converting path and then accesses a SDRAM memory array 660 through an SDRAM interface 650. Here, the signal converting path includes a signal converter 620.

The dual port SDRAM 600 of FIG. 7 operates in an SDRAM mode. When coupled to a processor A 670 with a SDRAM external interface bus (EBI) 672 via a port A, the dual port SDRAM 600 bypasses an address 671, control signals 673, a clock 677, and data 679 through bypass paths to access a SDRAM memory array 660 through an SDRAM interface 650. Here, the bypass paths represent paths 611, 613, 615, and 617 bypassed from a first selector 610 to a second selector 640.

Here, the PSRAM mode represents an operating mode of the dual port SDRAM of when the dual port SDRAM is coupled to the processor with the PSRAM external interface bus, and the SDRAM mode represents an operating mode of the dual port SDRAM of when the dual port SDRAM is coupled to the processor with the SDRAM external interface bus.

The dual port SDRAM 600 allows data access from a processor B 660 with an SDRAM external interface EBI 662 via a port B. The processor B 660 with the SDRAM external interface bus 662 outputs an address 661 and a plurality of control signals 663 through a plurality of address pins, a plurality of control signal pins, and a plurality of data pins of the dual port SDRAM 600, and the dual port SDRAM 600 receives or outputs data 669 via the port B by using a second SDRAM 670.

Referring to FIG. 6, the dual port SDRAM 600 according to the second exemplary embodiment of the present invention includes a converting unit 630, a first SDRAM interface 650, a DRAM memory array 660, and a second SDRAM interface 670. The converting unit 630 includes a first selector 610, a signal converter 620, and a second selector 640.

The converting unit 630 receives the address 651 from and a plurality of control signals 653 and receives/outputs data 659 from/to the processor A 650 with the PSRAM external interface bus 652 through a plurality of address pins, a plurality of control signal pins, and a plurality of data pins. The converting unit 630 converts the control signals 653 which conform to the PSRAM interface into the control signals 633 or bypasses the control signals 653 through the bypass paths 611, 613, 615, and 617 in response to a selecting signal 654.

The first selector 610 provides the address 651, a plurality of control signals 653, the clock 677, and the data 659 to the signal converter 620 or bypasses the address 651, a plurality of control signals 653, the clock 677, and the data 659 to the second selector 640, in response to the selecting signal 654. The selecting signal 654 may be inputted through an external pin of the dual port SDRAM 600. The selecting signal 654 may be set to have a predetermined state during a process for connecting the dual port SDRAM 600 to a certain processor, depending on whether the dual port SDRAM 600 is coupled to the processor with the PSRAM external interface bus or the processor with the SDRAM external interface bus. In more detail, the selecting signal 654 may be previously set to have an active state when the dual port SDRAM 600 is coupled to the processor A 670 with the SDRAM external interface bus EBI 672 via the port A and may be previously set to have a non active state when the dual port SDRAM 600 is coupled to the processor A 650 with the PSRAM external interface bus EBI 652 via the port A. Here, the active state represents a high level state, and the non active state represents a low level state. To the contrary, the active state may represent a low level state, and the non active state may represent a high level state.

The first selector 610 may include a plurality of DEMUXs 692, 694 and 698 which perform a demultiplexing operation in response to the selecting signal 654. FIG. 8 shows that the first selector 620 includes a plurality of DEMUXes, but the first selector 620 may includes any other circuit which performs a function for receiving one input signal to select one of two output signals in response to the selecting signal 654.

The signal converter 620 receives the control signals 653 such as a chip select signal /CS, a write enable signal /WE, and an output enable signal /OE which follow the operation timing of the PSRAM to generate the control signals 633 such as a chip select signal /CS, a row address strobe signal /RAS, a column address strobe signal /CAS, and a write enable signal /WE which are used to perform the read operation, the write operation and the refresh operation of the SDRAM.

The signal converter 620 receives, for example, an N-bit address 651 from the processor A 650 with the PSRAM external interface bus 652 and converts the N-bit address 651 into the address 631 which conform to an address system of the SDRAM before outputting the N-bit address 651. For example, the address 631 may include a row address, a column address and a bank address BA. The bank address may have one bit when the DRAM memory array 660 has two banks and may have two bits when the DRAM memory array 660 has four banks. The SDRAM interface 650 may be arranged for each bank indicated by each bank address.

The signal converter 620 controls the input/output timing of data inputted from the processor A 650 with the PSRAM external interface bus 652 or data read from the DRAM memory array 660 to follow the operation timing of the read operation, the write operation and the refresh operation.

The operation of the signal converter 620 is described below in more detail with reference to FIG. 9.

Referring to FIG. 9, the signal converter 620 includes a row address extractor 621, a column address extractor 625, a refresh controller 623, a MUX 626, a converter 627, a command controller 629, and an I/O buffer 628. The signal converter 620 may further include a bank address extractor 624 when the DRAM memory array 660 includes a plurality of banks. Hereinafter, it is assumed that the DRAM memory array 660 includes a plurality of banks.

The bank address extractor 624 extracts a bank address BA from an upper address among an address 612 based on the bank address control signal S2.

The row address extractor 621 extracts a row address from the upper address among the address 612 based on the row address control signal S3, and the column address extractor 625 extracts a column address from a lower address among the address 612 based on the column address control signal S4. The MUX 626 sequentially outputs the extracted row address and column address based on the MUX control signal S5.

The refresh controller 623 generates a clock timing signal and provides the clock timing signal to the command controller 629. The command controller 629 generates a clock CLK 635 to be provided to the first SDRAM interface 650 based on the clock timing signal. Here, the refresh controller 623 may be configured to generate the clock CLK 635 to be provided directly to the first SDRAM interface 650. The refresh controller 623 may be realized by using an internal oscillating circuit.

The converter 627 receives the control signals 614 which follows the operation timing of the PSRAM such as /CS, /WE and /OE and provides timing information Si for performing the read operation, the write operation, and the refresh operation of the SDRAM to the command controller 629. The converter 627 generates the bank address control signal S2, the row address control signal S3, the column address control signal S4, the MUX control signal S5, and the I/O buffer control signal S6 which are respectively used to control the operation timing of the bank address extractor 624, the row address extractor 621, the column address extractor 625, the MUX 626, the command controller 629, and the I/O buffer 628 by using the control signals 614 which follows the operation timing of the PSRAM.

The command controller 629 receives the timing information Si generated by the converter 627 to generate the control signals 633 such as /CS, /RAS, /CAS, /WE, and CKE (clock enable signal) which are used to perform the row active operation, the read operation, the write operation, and the refresh operation of the SDRAM.

The command controller 629 generates the control signals 633 such as /CS, /RAS, /CAS, /WE, and CKE (clock enable signal) by controlling the operation timing so that the read/write operations do not collide with the refresh operation of the SDRAM.

/CS, /RAS, /CAS, and /WE with the controlled timing for performing the row active operation, the read operation, the write operation, and the refresh operation of the SDRAM are generated by using the control signals 614 which conform to the PSRAM interface such as /CS, /WE and /OE.

In more detail, while the refresh operation is not performed, when among the control signals 614 which conform to the PSRAM interface, /CS and /WE get active, the signal levels (high, low) of /CS, /RAS, /CAS, and /WE which conform to the SDRAM interface are controlled to perforin the write operation. That is, when among the control signals 614 which conform to the PSRAM interface, /CS and /WE get active, in order to perform the write operation of the SDRAM, the CS, /WE, /RAS, and /CAS which conform to the SDRAM interface are generated with a low level, a high level, a low level, and a high level, respectively, to activate an active command, thereby triggering the row active operation for activating a row line corresponding to a predetermined row address of the SDRAM. Then, /CS, /WE, /RAS, and /CAS which conform to the SDRAM interface are generated with a low level, a low level, a high level, and a low level, respectively, to activate a write command, thereby triggering the write operation.

In more detail, while the refresh operation is not performed, when among the control signals 614 which conform to the PSRAM interface, /CS and /OE get active, the signal levels (high, low) of /CS, /RAS, /CAS, and /WE which conform to the SDRAM interface are controlled to perforin the read operation. That is, when among the control signals 614 which conform to the PSRAM interface, /CS and /OE get active, in order to perform the read operation of the SDRAM, the CS, /WE, /RAS, and /CAS which conform to the SDRAM interface are generated with a low level, a high level, a low level, and a high level, respectively, to activate the active command, thereby triggering the row active operation for activating a row line corresponding to a predetermined row address of the SDRAM. Then, /CS, /WE, /RAS, and /CAS which conform to the SDRAM interface are generated with a low level, a high level, a high level, and a low level, respectively, to activate a read command, thereby triggering the read operation.

FIG. 9 shows that the converter 627 and the command controller 629 are realized by two separate blocks, but the converter 627 and the command controller 629 may be realized by a single controller (Finite State Machine; FSM).

The I/O buffer 628 buffers the data 618 in an input buffer according to the I/O buffer control signal S6 of the converter 627 and then outputs the data 618 to the first SDRAM interface 150 according to a write operation timing of the SDRAM, and buffers the data 637 in an output buffer and then outputs the data 637 according to a read operation timing of the SDRAM.

Referring to FIG. 10, the second selector 640 may include a plurality of MUXs 642, 644, 646, and 648 which perform the multiplexing operation in response to the selecting signal 654. FIG. 10 shows that the second selector 620 includes a plurality of MUXs, but it may be realized by circuits which perform a function for selecting one of two input signals in response to the selecting signal 654.

The second selector 640 selects either the address 611, the control signals 613, the clock 615, and the data 617 which are bypassed or the address 631, the control signals 633, the clock 635, and the data 637, in response to the selecting signal 654 and then outputs the selected ones as the address 641, the control signals 643 such as /CS, /RAS, /CAS, and /WE, the clock 645, and the data 647.

Returning to FIG. 6, the first SDRAM interface 650 receives the address 641, the control signals 643, the clock 645, and the data 647 from the second selector 640, decodes the address 641 into the row address and the column address and outputs the decoded address 651 to the DRAM memory array 660, and receives/outputs the data 653 from/to the DRAM memory 660 according to the operation timing of the read operation, the write operation and the refresh operation of the SDRAM. The first SDRAM interface 650 includes a command decoder, a row decoder, a column decoder, and a sense amplifier which are used in the typical SDRAM interface.

The second SDRAM interface 670 receives the address 661, the control signals 663, and a clock 667 from the processor B 660 with the SDRAM external interface bus 662 via the port B, decodes the address 661 into the row address and the column address and outputs the decoded address 671 to the DRAM memory array 660, and receives/outputs the data 673 from/to the DRAM memory 660 according to the operation timing of the read operation, the write operation and the refresh operation of the SDRAM. The second SDRAM interface 670 includes a command decoder, a row decoder, a column decoder, and a sense amplifier which are used in the typical SDRAM interface.

The memories with a dual port have been described with reference to FIGS. 6 and 7, but the present invention can be applied to a memory device with a single port. For example, the present invention can be applied to a memory device comprised of the first selector 610, the signal converter 620, the second selector 640, the memory interface 650, and the memory array 660 in which the second memory interface 670 is removed from the dual port memory of FIGS. 6 and 7.

Figure 11:
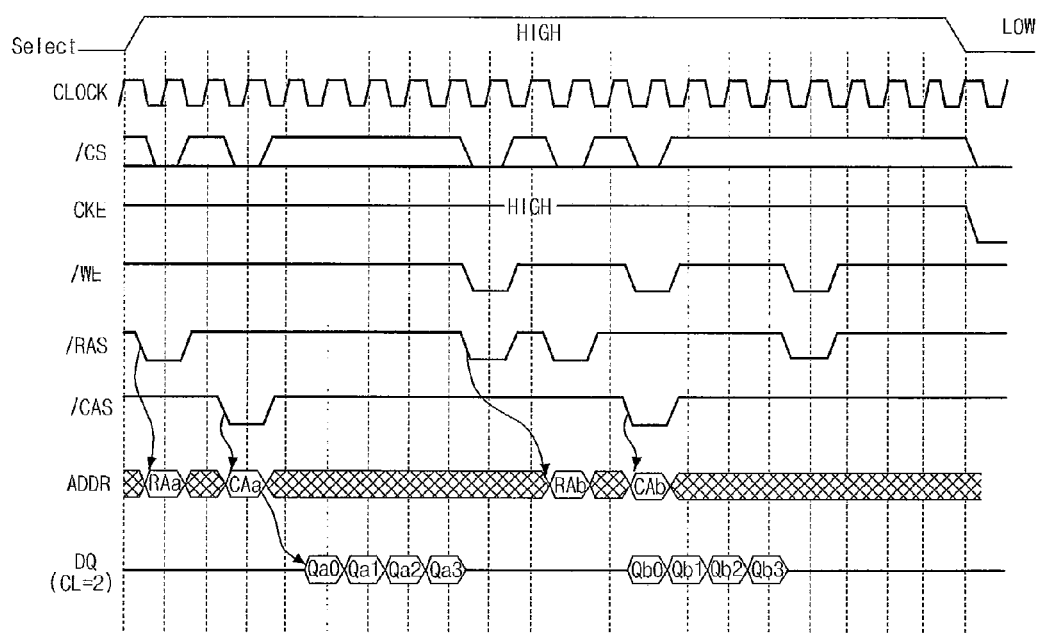
FIG. 11 is a timing diagram illustrating read and write operations when the dual port SDRAM according to the second exemplary embodiment of the present invention operates in the SDRAM mode.

FIG. 11 is a timing diagram illustrating the read and write operations when the dual port SDRAM according to the second exemplary embodiment of the present invention operates in the SDRAM mode. In FIG. 11, the clock signal CLK, /CS, /RAS, CAS, and /WE are signals generated by the command controller 629 of FIG. 9.

Referring to FIG. 11, while the selecting signal maintains a high level after transitioning from a low level to a high level, the dual port SDRAM synchronized with the clock signal CLK operates in the SDRAM mode to read/write data from/into the dual port memory device. In case where the dual port memory device operates in the SDRAM mode, since the dual port memory device is synchronized with the clock signal, the clock enable signal CKE has a high level. When all of /RAS, /CAS and /WE have a high level, No operation (NOP) state is maintained. When /CS has a high level, the command decoder is disabled, an input of /RAS, /CAS, /WE, and the address is ignored. FIG. 8 shows the read and write operations in the memory array corresponding to a bank indicated by the bank address.

First, the read operation is performed as follows. When the selecting signal, /CS, /WE, /RAS, and /CAS have a high level, a low level, a high level, a low level, and a high level, respectively, a row address is applied to an address pin, so that a row line corresponding to the row address of the memory array 160 is activated ("row active"). When /CS, /WE, /RAS, and /CAS have a low level, a high level, a high level, and a low level, respectively, the read command is inputted to apply a column address to the address pin, so that data are read out through a column line corresponding to the column address of the memory array 160 when a predetermined delay time (CAS Latency) lapses after the read command is inputted. FIG. 11 shows a case that the CAS latency is 2 clocks.

Next, the write operation is performed as follows. When the selecting signal, /CS, /WE, /RAS, and /CAS have a high level, a low level, a low level, a low level, and a high level, respectively, a row address is applied to the address pin, so that a row line corresponding to the row address of the memory array 160 is activated ("row active"). When /CS, /WE, /RAS, and /CAS have a low level, a low level, a high level, and a low level, respectively, the write command is inputted to apply a column address to the address pin, so that data are written through a column line corresponding to the column address of the memory array 160.

Figure 12:
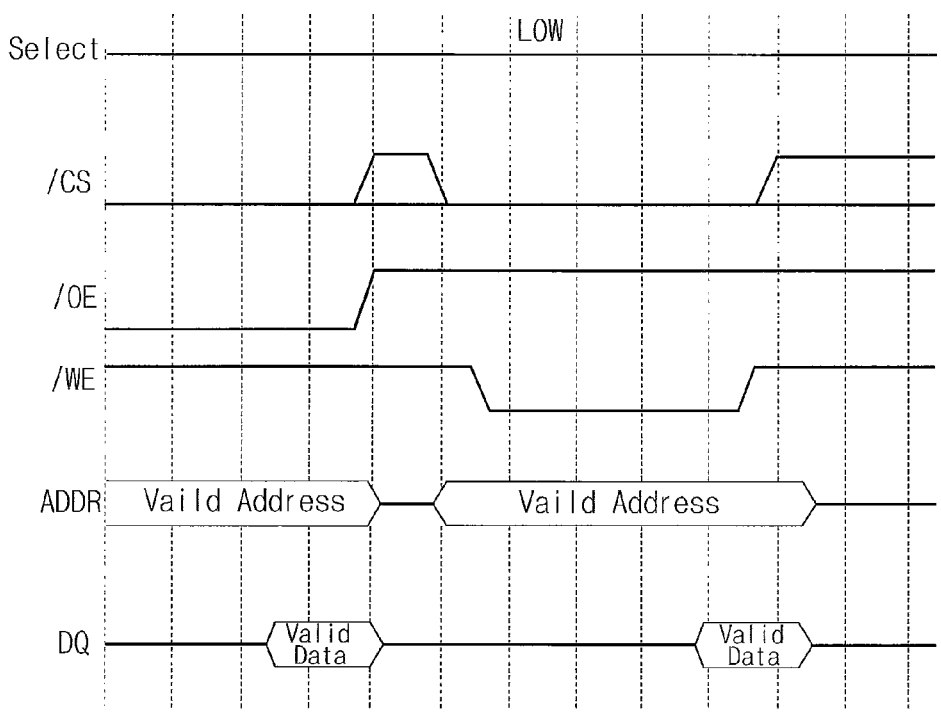
FIG. 12 is a timing diagram illustrating the read and write operations when the dual port SDRAM according to the second exemplary embodiment of the present invention operates in a PSRAM mode.

FIG. 12 is a timing diagram illustrating the read and write operations when the dual port SDRAM according to the second exemplary embodiment of the present invention operates in a PSRAM mode.

Referring to FIG. 12, while the selecting signal maintains a low level, the PSRAM mode operates to read/write data from/into the dual port memory device.

First, the read operation is performed as follow. When the selecting signal, /CS, /WE, and /OE have a low level, a low level, a high level, and a low level, an address is applied to the address pin, so that data are read out from memory cells of the memory array corresponding to the address.

Next, the write operation is performed as follows. When the selecting signal, /CS, /WE, and /OE have a low level, a low level, a low level, and a high level, an address is applied to the address pin, so that data are written into memory cells of the memory array corresponding to the address.

That is, when the selecting signal gets active, the dual port SDRAM operates in the SDRAM mode, and the bypass paths of FIG. 7 get activated to perform the read and write operations, whereas when the selecting signal gets non-active, the dual port SDRAM operates in the PSRAM mode, and the address 612, the control signals 614 such as /CS, /WE, and /OE are converted into the address 631 and the control signals 633 such as /CS, /RAS, /CAS, and /WE to then perform the read and write operations.

Figure 13:
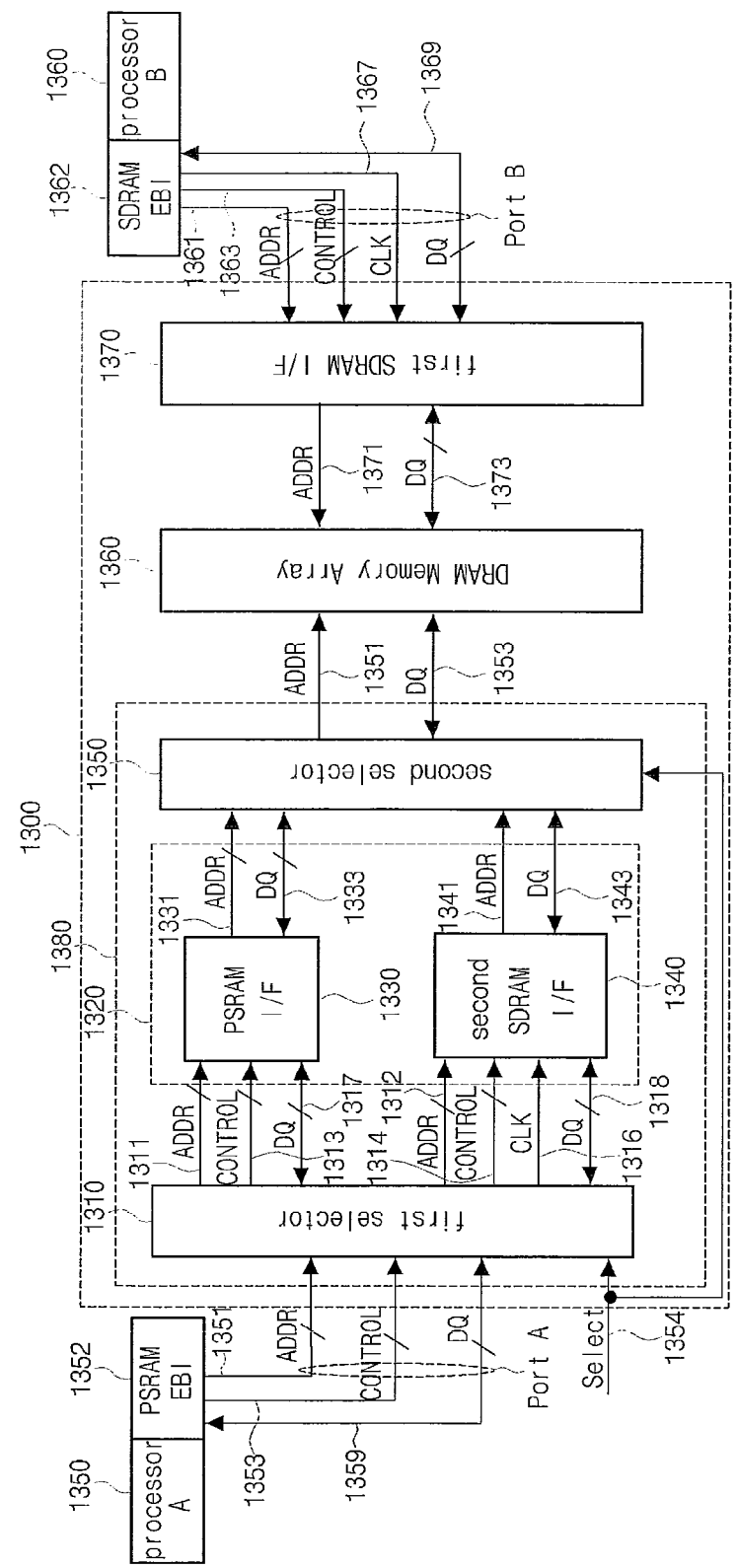
FIG. 13 is a block diagram illustrating a state that a dual port SDRAM according to a third exemplary embodiment of the present invention is coupled to a processor with a PSRAM external interface bus and a processor with an SDRAM external interface bus.
Figure 14:
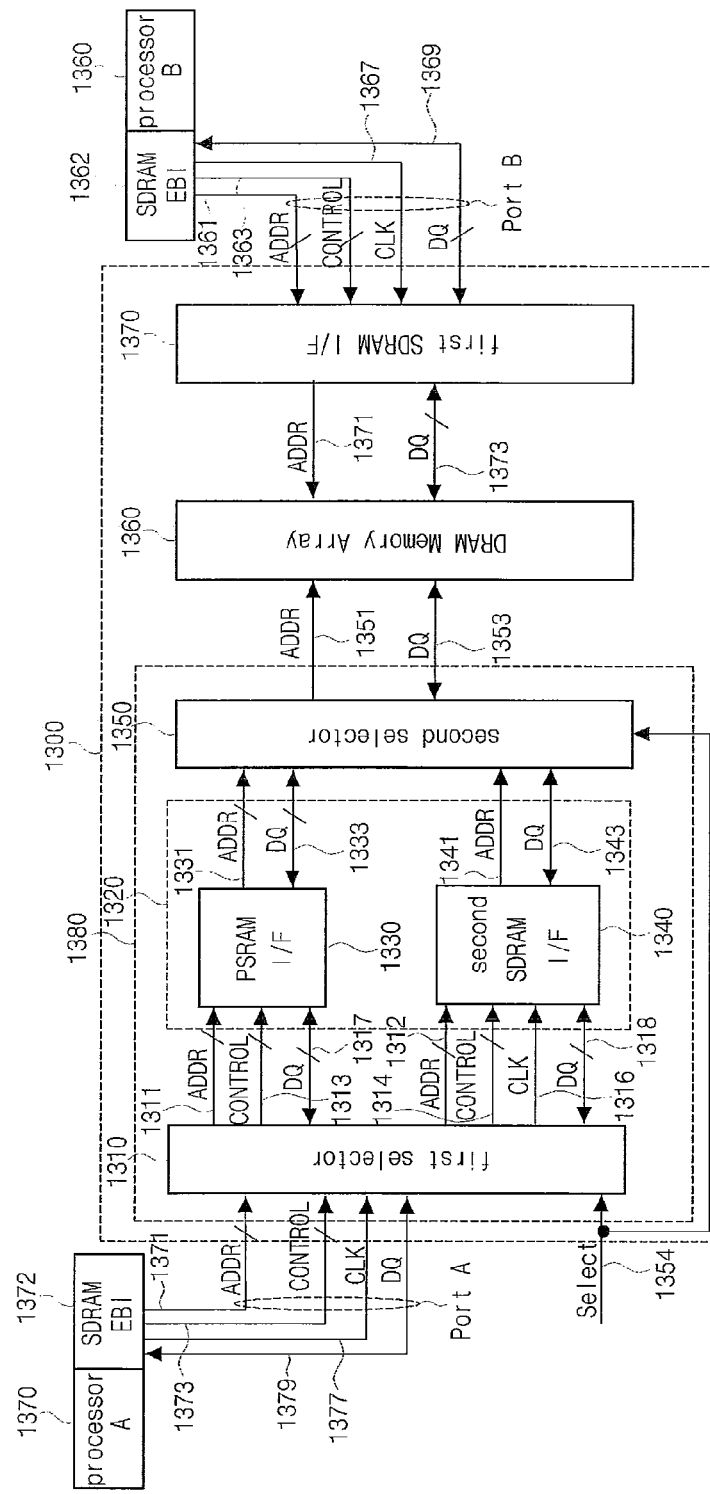
FIG. 14 is a block diagram illustrating a state that the dual port SDRAM according to the third exemplary embodiment of the present invention is coupled to two processors with an SDRAM external interface bus.
Figure 15:
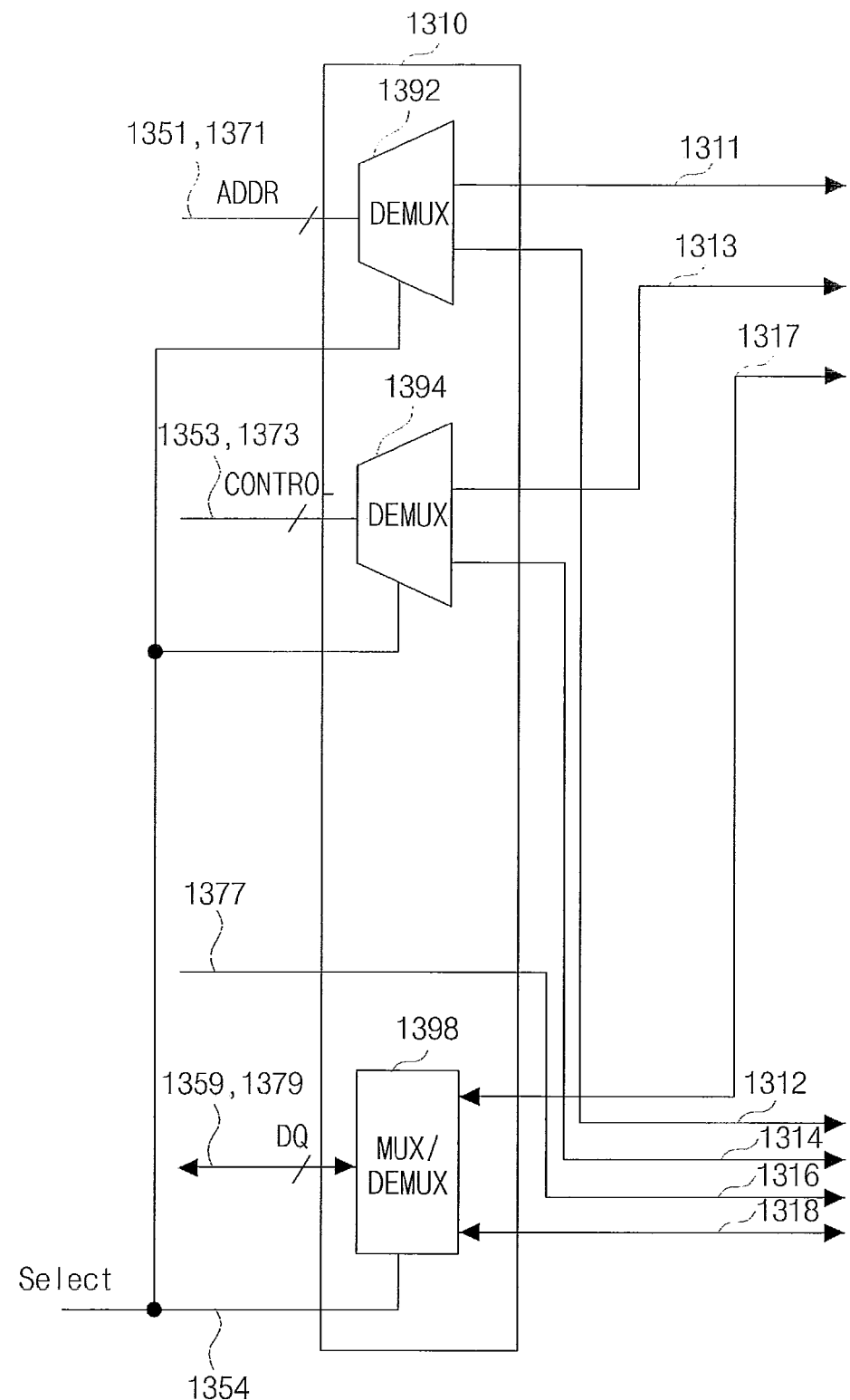
FIG. 15 is a block diagram illustrating a first selector of the dual port SDRAM of FIG. 13 or 14.
Figure 16:
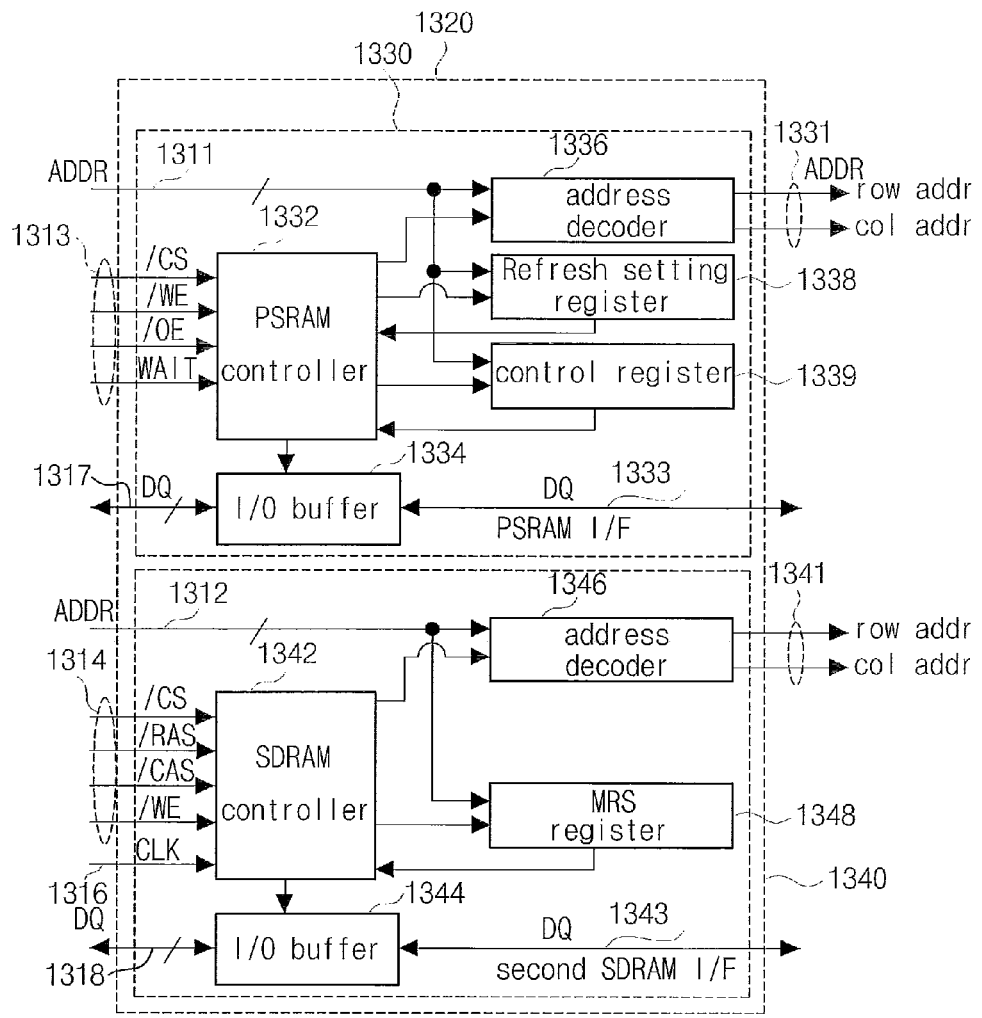
FIG. 16 is a block diagram illustrating the PSRAM interface and the SDRAM interface of FIG. 13 according to the third exemplary embodiment of the present invention.
Figure 17:
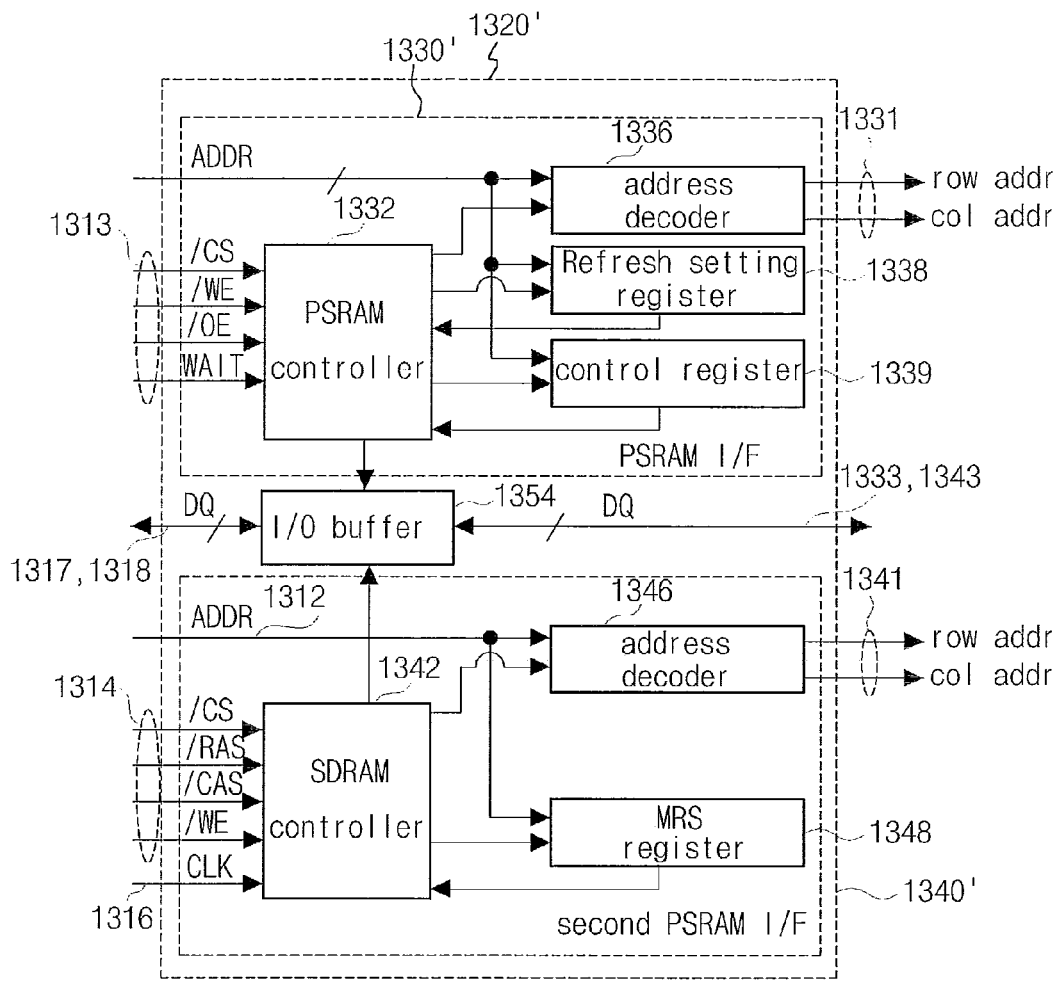
FIG. 17 is a block diagram illustrating the PSRAM interface and the SDRAM interface according to the third exemplary embodiment of the present invention of FIG. 13.
Figure 18:
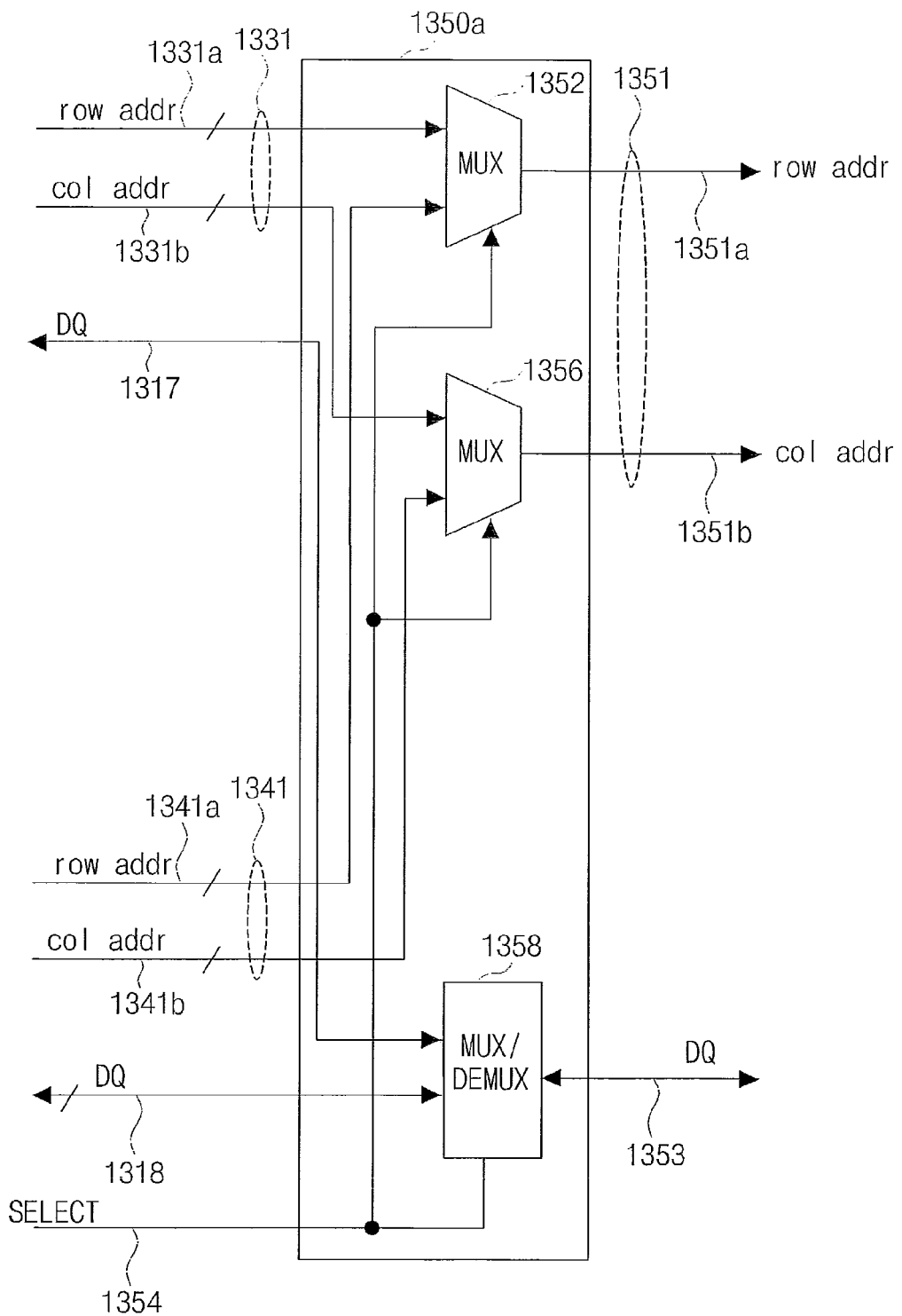
FIG. 18 is a block diagram illustrating a second selector of the dual port SDRAM of FIGS. 13 and 14.

FIG. 13 is a block diagram illustrating a state that a dual port SDRAM according to a third exemplary embodiment of the present invention is coupled to a processor with a PSRAM external interface bus and a processor with an SDRAM external interface bus. FIG. 14 is a block diagram illustrating a state that a dual port SDRAM according to the third exemplary embodiment of the present invention is coupled to two processors with an SDRAM external interface bus. FIG. 15 is a block diagram illustrating a first selector of the dual port SDRAM of FIG. 13 or 14. FIG. 16 is a block diagram illustrating the PSRAM interface and the SDRAM interface of FIG. 13 according to the third exemplary embodiment of the present invention. FIG. 17 is a block diagram illustrating the PSRAM interface and the SDRAM interface according to the third exemplary embodiment of the present invention of FIG. 13. FIG. 18 is a block diagram illustrating a second selector of the dual port SDRAM of FIGS. 13 and 14. The dual port SDRAM 1300 has a unit memory cell structure of a DRAM.

The dual port SDRAM 1300 of FIG. 13 is coupled to a processor A 1350 with a PSRAM external interface bus EBI 1352 via a port A to operate in a PSRAM mode and accesses a DRAM memory array 1360 such that the dual port SDRAM 1300 receives an address 1351, control signals 1353, and data 1359 which conform to the PSRAM interface, decodes row/column addresses through the PSRAM interface 1320, and performs an internal refresh operation.

The dual port SDRAM 1300 FIG. 14 is coupled to a processor A 1370 with a SDRAM external interface bus EBI 1372 via a port A to operate in a SDRAM mode and accesses the DRAM memory array 1360 such that the dual port SDRAM 1300 receives an address 1371, control signals 1373, a clock 1377, and data 1379 and decodes row/column addresses through a second SDRAM interface 1340.

Here, the PSRAM mode represents an operation mode of the dual port SDRAM of when the dual port SDRAM is coupled to a processor with the PSRAM external interface bus, and the SDRAM mode represents an operation mode of the dual port SDRAM of when the dual port SDRAM is coupled to a processor with the SDRAM external interface bus.

The dual port SDRAM 1300 allows data access from a processor B 1360 with an SDRAM external interface EBI 1362 via a port B. The processor B 1360 with the SDRAM external interface bus 1362 outputs an address 1361 and a plurality of control signals 1363 through a plurality of address pins, a plurality of control signal pins, and a plurality of data pins of the dual port SDRAM 1300, and the dual port SDRAM 1300 receives or outputs data 1369 via the port B by using a first SDRAM interface 1370.

Referring to FIG. 13, the dual port SDRAM 1300 according to the third exemplary embodiment of the present invention includes a dual interface 1380, the DRAM memory array 1360, and the first SDRAM interface 1370. The dual interface 1380 includes a first selector 1310, an interface 1320, and a second selector 1350.

The dual interface 1380 accesses the DRAM memory array 1360 through either the PSRAM interface 1330 (see FIG. 13) or the second SDRAM interface 1340, in response to a selecting signal 1354.

The first selector 1310 provides an address 1351, a plurality of control signals 1353, and data 1359 to the PSRAM interface 1330 through a first signal path or provides an address 1371, a plurality of control signals 1373, a clock 1377, and data 1379 to the second SDRAM interface 1340 through a second signal path, in response to the selecting signal 1354.

The selecting signal 1354 may be inputted through an external pin of the dual port SDRAM 1300. The selecting signal 1354 may be set to have a predetermined state during a process for connecting the dual port SDRAM 1300 to a certain processor, depending on whether the dual port SDRAM 1300 is coupled to the processor with the PSRAM external interface bus or the processor with the SDRAM external interface bus. In more detail, the selecting signal 1354 may be previously set to have an active state when the dual port SDRAM 1300 is coupled to the processor A 1370 with the SDRAM external interface bus EBI 1372 via the port A and may be previously set to have a non active state when the dual port SDRAM 1300 is coupled to the processor A 1350 with the PSRAM external interface bus EBI 1352 via the port A. Here, the active state represents a high level state, and the non active state represents a low level state. To the contrary, the active state may represent a low level state, and the non active state may represent a high level state.

The first selector 1310 may include a plurality of DEMUXs 1392 and 1394 and a MUX/DEMUX 1398 which perform a demultiplexing operation in response to the selecting signal 1354. FIG. 15 shows that the first selector 1310 includes a plurality of DEMUXs and a MUX/DEMUX, but the first selector 1310 may include any other circuit which performs a function for receiving one input signal to select one of two output signals in response to the selecting signal 1354.

When the selecting signal is in a non-active state, the interface 1320 receives the control signals 1313 such as a chip select signal /CS, a write enable signal /WE, an output enable signal /OE, and a wait signal WAIT and an address 1311 which conform to the PSRAM interface and decodes the address to access the DRAM memory array 1360, thereby performing the read operation, the write operation and the refresh operation.

When the selecting signal is in an active state, the interface 1320 receives the control signals 1314 such as a chip select signal /CS, a row address strobe /RAS, a column address strobe /CAS, and a write enable signal /WE, a clock CLK 1316, and an address 1312 which conform to the SDRAM interface and decodes the address to access the DRAM memory array 1360, thereby performing the read operation, the write operation and the refresh operation.

The operation of the interface 1320 is described below in more detail with reference to FIG. 16.

Referring to FIG. 16, the interface 1320 includes a PSRAM interface 1330 and a second SDRAM interface 1340.

The PSRAM interface 1330 includes a PSRAM controller 1332, an address decoder 1336, a refresh setting register 1338, a control register 1339, and an I/O buffer 1334.

Even though not shown, when the DRAM memory array 1360 includes a plurality of banks, the PSRAM interface 1330 and the second SDRAM interface 1340 are arranged for each bank. For example, a certain one bit among the address 1311 inputted to the PSRAM interface 1330 may indicate one of two banks, the PSRAM interface 1330 is arranged for each of the two banks, and so the total two PSRAM interface 1330 are arranged. For example, the address 1312 inputted to the second SDRAM interface 1340 may includes a separate bank address BA, and when the bank address is a one bit address, the bank address can indicate one of the two banks, the second SDRAM interface 1340 is arranged for each of the two banks, and so the total two SDRAM interface portions 1340 are arranged.

The address decoder 1336 may include a row buffer, a column buffer, a refresh controller, a row decoder, and a column decoder. The row buffer buffers a row address among the inputted address 1311 and provides the row address to the row decoder under the control of the PSRAM controller 1332, and the column buffers a column address among the inputted address 1311 and provides the column address to the column decoder under the control of the PSRAM controller 1332. In order to perform the internal refresh operation under control of the PSRAM controller 1332, the refresh controller generates a row address for indicating a word line to be refreshed and provides the row address to the row decoder, at a timing for performing the internal refresh operation.

The row decoder decodes and outputs the row address outputted from the row buffer under control of the PSRAM controller 1332, and the column decoder decodes and outputs the column address outputted from the column buffer under control of the PSRAM controller 1332.

The refresh setting register 1338 receives the address 1311, stores information necessary for performing the internal refresh operation and provides the information necessary for performing the internal refresh operation to the PSRAM controller 1332, under control of the PSRAM controller 1332.

The control register 1339 receives the address 1311, stores operation mode (asynchronous mode, synchronous burst mode, and page mode) information and burst length information of during burst read and burst write operations, and provides the operation mode information and the burst length information to the PSRAM controller 1332, under control of the PSRAM controller 1332.

The refresh setting register 1338 and the control register 1339 are set to a predetermined default value when the dual port memory 100 is powered up and is updated during an operation of the PSRAM interface 1330. For example, the operation mode bit of the control register 1339 may be set to an asynchronous mode when powered up and be set to a synchronous burst mode during its operation.

The PSRAM controller 1332 generates predetermined commands for controlling the read operation, the write operation and the refresh operation based on the control signals 1313 which conform to the PSRAM interface such as /CS, /WE, /OE, and WAIT, and generates predetermined timing signals for performing the read operation, the write operation and the refresh operation based on the predetermined commands to control the address decoder 1336, the refresh setting register 1338, the control register 1339, and the I/O buffer 1334.

The I/O buffer 1334 buffers the data 1317 in the input buffer (not shown) and then writes the data 1317 into the DRAM memory array 1360 according to the write operation timing of the PSRAM, based on the operation mode information and the bust length information under control of the PSRAM controller 1332, and reads the data 1333 from the DRAM memory array 1360, buffers the data 1333 in the output buffer and then reads out the data 1333 according to the read operation timing of the PSRAM.

The second SDRAM interface 1340 includes an SDRAM controller 1342, an address decoder 1346, a mode register set (MRS) register 1348, and an I/O buffer 1344.

The address decoder 1346 includes a row buffer, a column buffer, a refresh counter, a row decoder, and a column decoder. The row buffer buffers a row address among the inputted address 1312 and provides the row address to the row decoder under the control of the SDRAM controller 1342, and the column buffers a column address among the inputted address 1312 and provides the column address to the column decoder under the control of the SDRAM controller 1342. In order to perform the refresh operation under control of the SDRAM controller 1342, the refresh counter generates a row address for indicating a word line to be refreshed and provides the row address to the row decoder, at a timing for performing the internal refresh operation.

The row decoder decodes and outputs the row address outputted from the row buffer under control of the SDRAM controller 1342, and the column decoder decodes and outputs the column address outputted from the column buffer under control of the SDRAM controller 1342.

The MRS register 1348 receives the address 1312, stores data for controlling various operation modes of the SDRAM such as a CAS latency, a burst type, and a burst length, and provides the CAS latency information and the burst length information to the SDRAM controller 1342, under control of the SDRAM controller 1342.

The SDRAM controller 1342 generates predetermined commands for controlling the read operation, the write operation and the refresh operation based on the control signals 1314 which conform to the SDRAM interface such as /CS, /RAS, /CAS, and /WE, and generates predetermined timing signals for performing the read operation, the write operation and the refresh operation based on the predetermined commands to control the address decoder 1346, the MRS register 1348, and the I/O buffer 1344.

The I/O buffer 1344 buffers the data 1318 in the input buffer (not shown) and then writes the data 1318 into the DRAM memory array 1360 according to the write operation timing of the SDRAM, based on the CAS latency information and the bust length information under control of the SDRAM controller 1342, and reads the data 1343 from the DRAM memory array 1360, buffers the data 1343 in the output buffer and then reads out the data 1343 according to the read operation timing of the SDRAM.

Referring to FIG. 18, a second selector 1350*a* may include a plurality of MUXs 1352 and 1356 and a MUX/DEMUX 1358 which perform a multiplexing operation in response to the selecting signal 1354. FIG. 18 shows that the second selector 1350*a* includes a plurality of MUXs and a MUX/DEMUX, but the second selector 1350*a* may be realized by any other circuit which performs a function for selecting one of two input signals in response to the selecting signal 1354.

The MUX 1352 selects either a row address 1331*a* provided from the PSRAM interface 1330 or a row address 1341*a* provided from the second SDRAM interface 1340 and outputs the selected one as a row address 1351*a*, in response to the selecting signal 1354.

The MUX 1356 selects either a column address 1331*b* provided from the PSRAM interface 1330 or a column address 1341*b* provided from the second SDRAM interface 1340 and outputs the selected one as a column address 1351*b*, in response to the selecting signal 1354.

The MUX/DEMUX 1358 selects one of data 1317 provided from the PSRAM interface 1330 and data 1318 provided from the second SDRAM interface 1340 to output data 1353 in response to the selecting signal 1354 during the write operation, or provides the data 1353 read from the SDRAM memory array 1360 to the PSRAM interface 1330 or the second SDRAM interface 1340 in response to the selecting signal 1354 during the read operation.

FIG. 16 shows that each of the PSRAM interface 1320 and the second SDRAM interface 1340 has the I/O buffer, but the PSRAM interface 1320 and the second SDRAM interface 1340 may be configured to share a single I/O buffer 1354 as shown in FIG. 17.

In FIG. 17, the remaining blocks of the PSRAM interface 1330' and the second SDRAM interface 1340' are same in configuration to the corresponding blocks of FIG. 16, and thus descriptions on those are omitted.

Figure 19:
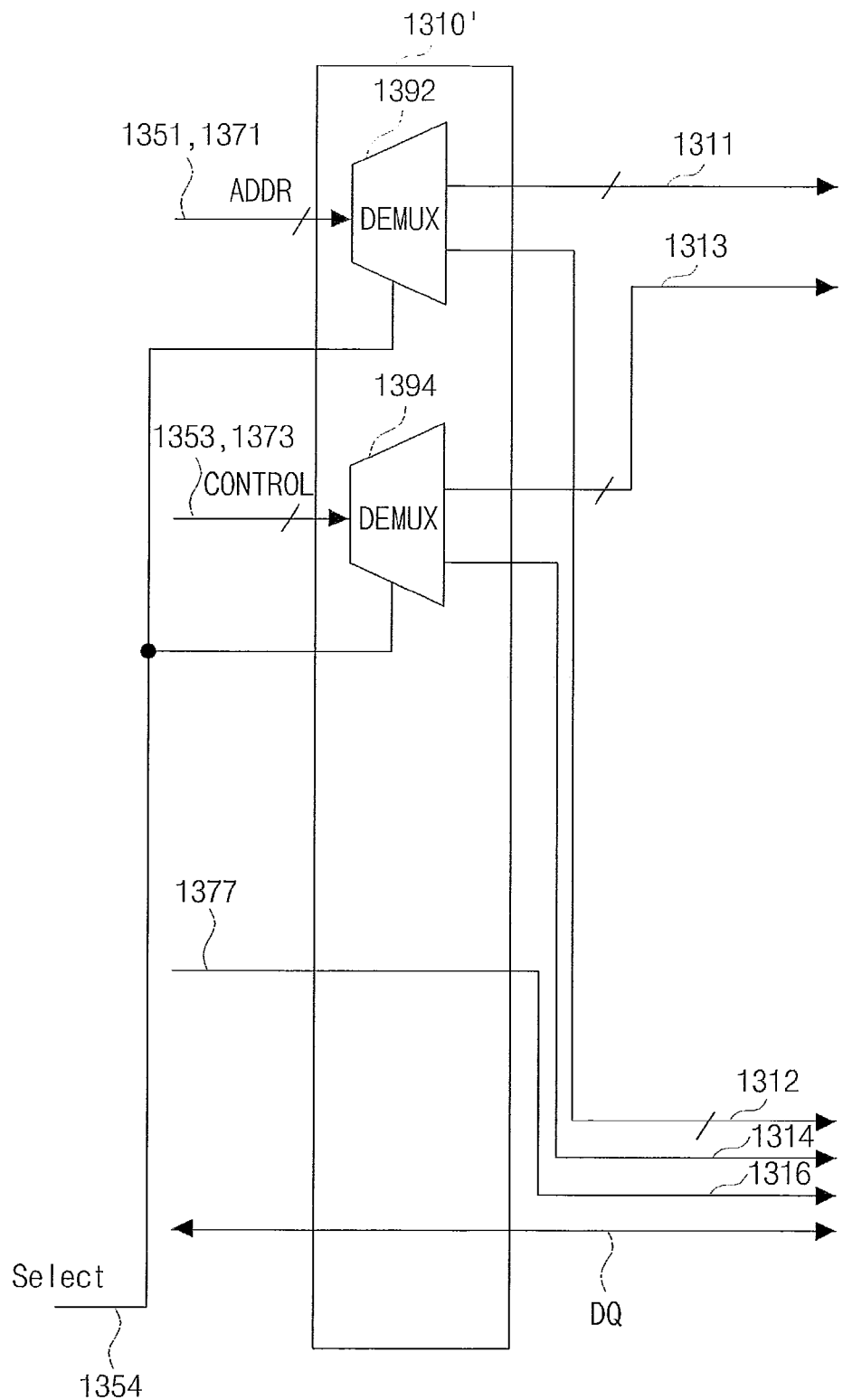
FIG. 19 is a block diagram illustrating a first selector when the PSRAM interface and the second SDRAM interface share one I/O buffer.
Figure 20:
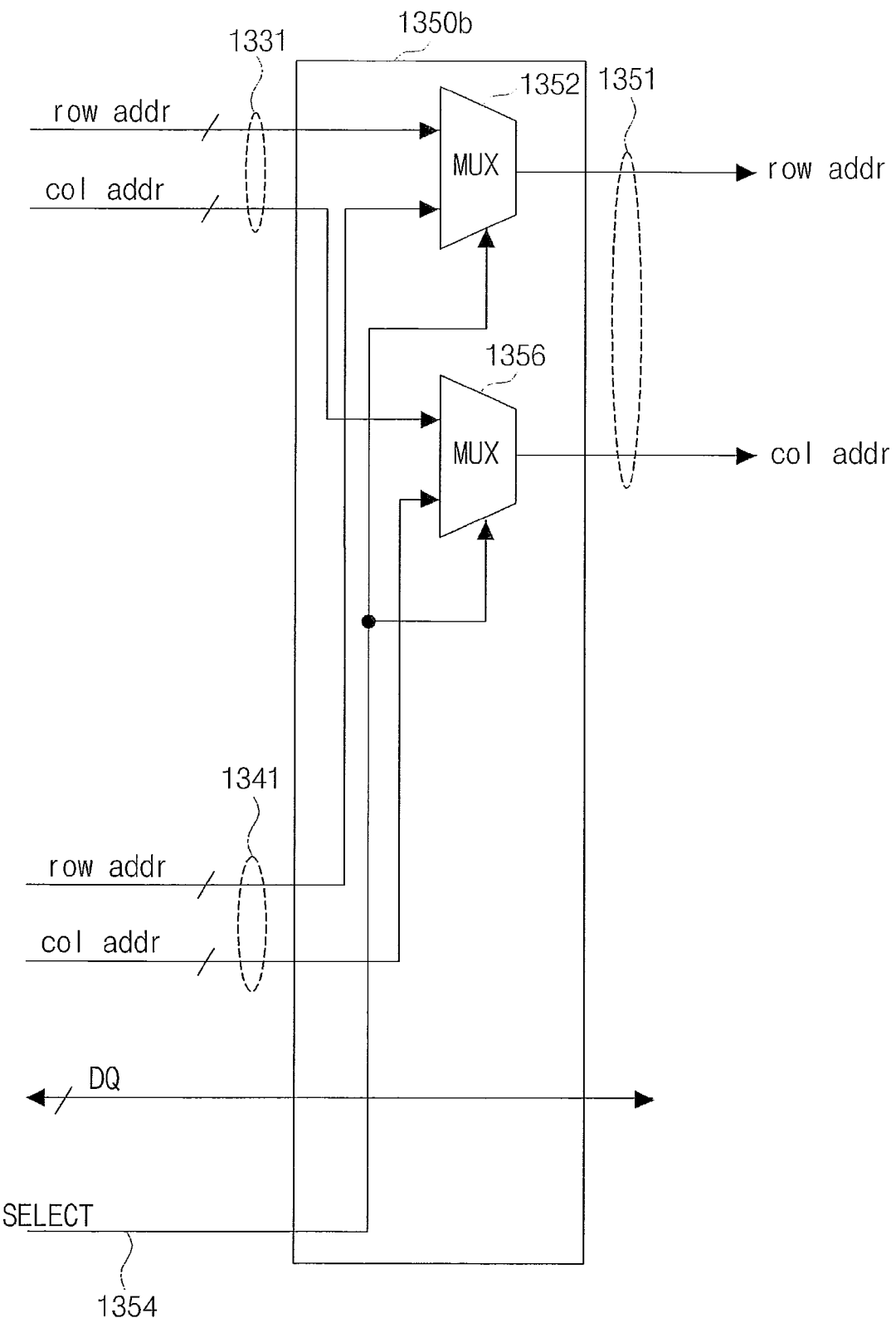
FIG. 20 is a block diagram illustrating a second selector when the PSRAM interface and the second SDRAM interface share one I/O buffer like FIG. 7.

In case where the PSRAM interface 1330' and the second SDRAM interface 1340' share the single I/O buffer 1354 as shown in FIG. 17, a first selector 1310' includes a DEMUR for demultiplexing an address and a DEMUR 1394 for demultiplexing a control signal as shown in FIG. 19, and a second selector 1350b includes a MUX 1352 for multiplexing a row address and a MUX 1356 for multiplexing a column address as shown in FIG. 20.

Now returning to FIG. 13, the first SDRAM interface 1370 receives the address 1361, the control signals 1363 and the clock 1367 from the processor B 1360 with the SDRAM external interface bus 1362 via the port B, decodes the address 1361 into a row address and a column address, outputs the decoded address 1371 to the DRAM memory array 1360, and receives/outputs the data 1373 from/to the DRAM memory array 1360 according to the operation timing of the read operation, the write operation and the refresh operation of the SDRAM. The first SDRAM interface 1370 has the same configuration as the internal blocks of the second SDRAM interface 1340 of FIG. 3.

The memory with a dual port has been described with reference to FIGS. 13 and 14, but the present invention can be applied to a memory device with a single port. For example, the present invention can be applied to a memory device comprised of the first selector 1310, the memory interface 1320, the second selector 1350, the DRAM memory array 1360 in which the first SDRAM interface 1370 is removed from the dual port memory of FIGS. 13 and 14.

Figure 21:
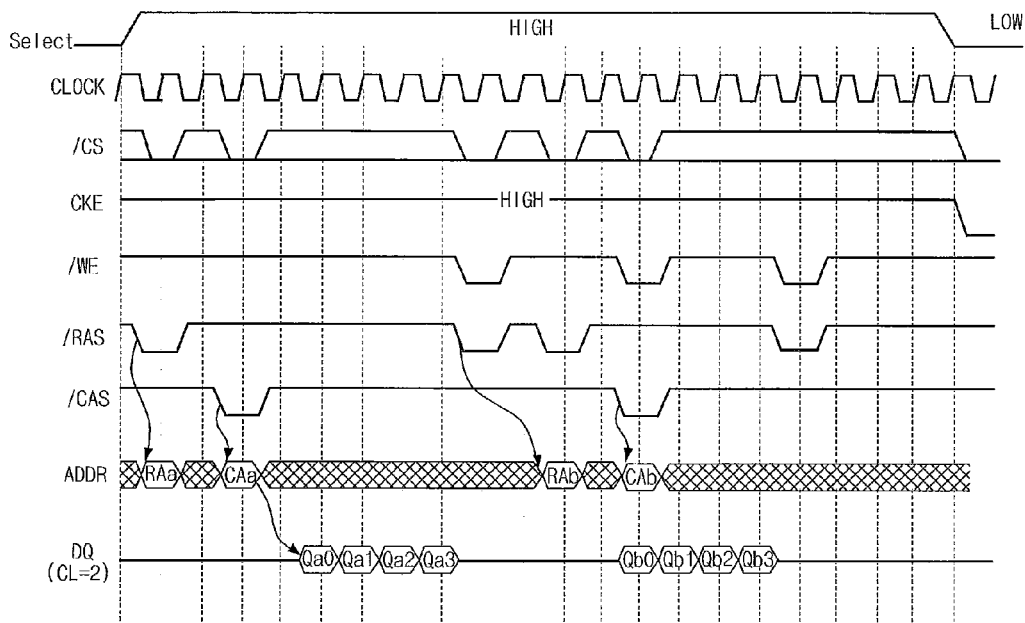
FIG. 21 is a timing diagram illustrating read and write operations when the dual port SDRAM according to the third exemplary embodiment of the present invention operates in the SDRAM mode.

FIG. 21 is a timing diagram illustrating the read and write operations when the dual port SDRAM according to the third exemplary embodiment of the present invention operates in the SDRAM mode. In FIG. 21, the clock signal CLK, /CS, /RAS, CAS, and /WE are same as the clock CLK, /CS, /RAS, /CAS, and /WE of FIG. 13.

Referring to FIG. 21, while the selecting signal maintains a high level after transitioning from a low level to a high level, the dual port SDRAM synchronized with the clock signal CLK operates in the SDRAM mode to read/write data from/into the dual port memory device. In case where the dual port SDRAM operates in the SDRAM mode, since the dual port memory device is synchronized with the clock signal, the clock enable signal CKE has a high level. When all of /RAS, /CAS and /WE have a high level, no operation (NOP) state is maintained. When /CS has a high level, an input of /RAS, /CAS, /WE, and the address is ignored. FIG. 8 shows the read and write operations in the memory array corresponding to a bank indicated by the bank address.

First, the read operation is performed as follows. When the selecting signal, /CS, /WE, /RAS, and /CAS have a high level, a low level, a high level, a low level, and a high level, respectively, a row address is applied to an address pin, so that a word line corresponding to the row address of the memory array 160 is activated ("row active"). When /CS, /WE, /RAS, and /CAS have a low level, a high level, a high level, and a low level, respectively, a column address is applied to the address pin, and data are read out from the memory array 160 when a predetermined delay time (CAS Latency) lapses after the column address strobe signal /CAS transitions from a high level to a low level. FIG. 21 shows a case that the CAS latency is 2 clocks.

Next, the write operation is performed as follows. When the selecting signal, /CS, /WE, /RAS, and /CAS have a high level, a low level, a low level, a low level, and a high level, respectively, a row address is applied to the address pin, so that a word line corresponding to the row address of the memory array 160 is activated ("row active"). When /CS, /WE, /RAS, and /CAS have a low level, a low level, a high level, and a low level, respectively, a column address is applied to the address pin, and data are writted into the memory array 160.

Figure 22:
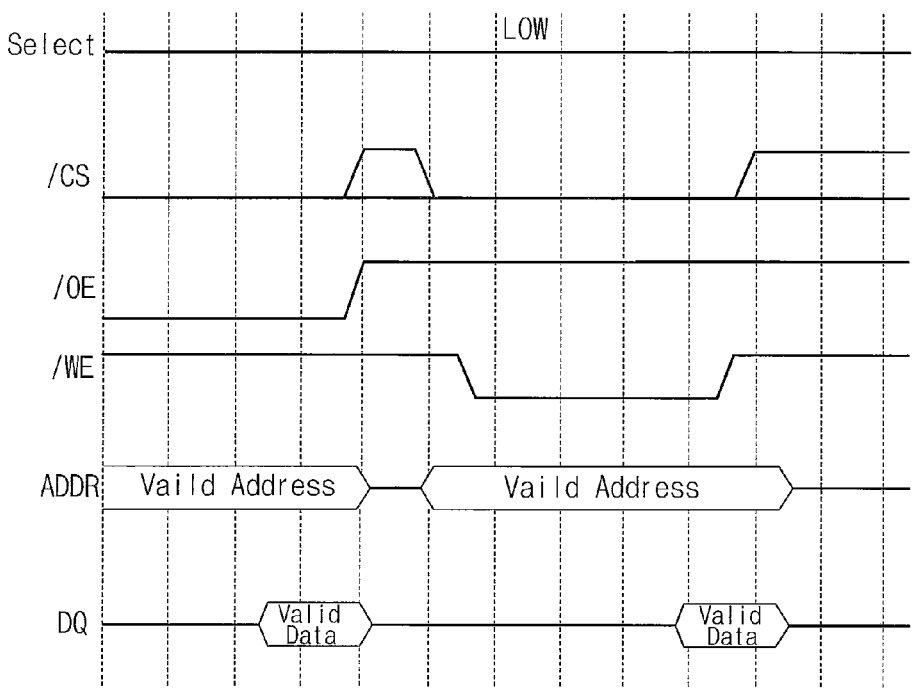
FIG. 22 is a timing diagram illustrating read and write operations when the dual port SDRAM according to the second exemplary embodiment of the present invention operates in a PSRAM mode.

FIG. 22 is a timing diagram illustrating the read and write operations when the dual port SDRAM according to the second exemplary embodiment of the present invention operates in a PSRAM mode.

Referring to FIG. 22, while the selecting signal maintains a low level, the PSRAM mode operates to read/write data from/into the dual port memory device.

First, the read operation is performed as follow. When the selecting signal, /CS, /WE, and /OE have a low level, a low level, a high level, and a low level, an address is applied to the address pin, so that data are read out from memory cells of the memory array 1360 corresponding to the address.

Next, the write operation is performed as follows. When the selecting signal, /CS, /WE, and /OE have a low level, a low level, a low level, and a high level, an address is applied to the address pin, so that data are written into memory cells of the memory array 1360 corresponding to the address.

That is, when the selecting signal gets active, the dual port SDRAM operates in the SDRAM mode, and the second SDRAM interface 1340 of FIG. 14 get activated to perform the read and write operations, whereas when the selecting signal gets non-active, the dual port SDRAM operates in the PSRAM mode, and the PSRAM interface 1330 of FIG. 13 get activated to perform the read and write operations.

INDUSTRIAL APPLICABILITY

As described above, exemplary embodiments of the present invention provides the dual port memory and the memory device which can be coupled to processors with difference memory interfaces.

Thus, the dual port memory device of the present invention can be used in case where one portable communication terminal has processors with different memory interfaces.

In particular, in the portable communication terminal such as a cellular phone, since a block for converting an address and a control signal which conform to the SRAM interface (or PSRAM interface) into an address and a control signal which conform to the SDRAM interface is added to the logic circuit of the existing SDRAM interface, the dual port memory device of exemplary embodiments of the present invention can be used by the processor with the SRAM external interface (or PSRAM external interface) and the processor with the SDRAM external interface without changing the logic circuit of the existing SDRAM interface.

In addition, in the portable communication terminal having processors with different memory interfaces, the dual port memory device which includes the DRAM memory array having the efficient layout area size can be selectively coupled to the processor with different memory interfaces.

While the present invention has been shown and described with reference to certain example embodiments thereof, it will be understood by those skilled in the art that various changes in form and details may be made therein without departing from the spirit and scope of the invention as defined by the appended claims.

The invention claimed is:

1. A dual port memory device, comprising:
   a memory array;
   a converting unit for converting an address and a control signal, which are inputted via a first port and conform to a first type memory interface, into an address and a control signal which conform to a second type memory interface and dividing an address, which is inputted via the first port and conforms to the first type memory interface, into a row address, a column address and a bank address which conform to the second type memory interface;
   a first memory interface for performing a read operation or a write operation for the memory array based on the address and the control signal which conform to the second type memory interface; and
   a second memory interface for performing a read operation or a write operation on the memory array based on an address and a control signal which are inputted via a second port and conform to the second type memory interface.

2. The dual port memory device of claim 1, wherein the converting unit comprises:
   a row address extractor for extracting a row address which conform to the second type memory interface from an address which is inputted via the first port and conform to the first type memory interface;
   a column address extractor for extracting a column address which conform to the second type memory interface from an address which is inputted via the first port and conform to the first type memory interface; and
   a bank address extractor for extracting a bank address which conform to the second type memory interface from an address which is inputted via the first port and conform to the first type memory interface.

3. The dual port memory device of claim 2, wherein the converting unit further comprises:
   a converter for receiving a control signal which is inputted via the first port and conform to the first type memory interface and generating timing information for performing a read operation, a write operation and a refresh operation which conform to the second type memory interface; and
   a command controller for receiving the timing information and generating a control signal for performing a read operation, a write operation and a refresh operation which conform to the second type memory interface.

4. The dual port memory device of claim 1, wherein the converting unit converts the address and the control signal which are inputted via the first port and conform to the first type memory interface into the address and the control signal which conform to the second type memory interface through a signal converting path in response to a selecting signal or bypasses the address and the control signal which are inputted via the first port and conform to the second type memory interface through a bypass path.

5. The dual port memory device of claim 4, wherein the converting unit comprises:
   a first selector for providing the address and the control signal which are inputted via the first port and conform to the first type memory interface to the signal converting path or providing the address and the control signal which are inputted via the first port and conform to the second type memory interface to the bypass path;
   a signal converter for converting an address and a control signal which are provided to the signal converting path and conform to the first type memory interface into the address and the control signal which conform to the second type memory interface; and
   a second selector for selecting an address and a control signal which are bypassed or an address and a control signal which are outputted from the signal converter and conform to the second type memory interface.

6. The dual port memory device of claim 5, wherein the first type memory interface includes a PSRAM interface, the second type memory interface includes an SDRAM interface, and the signal converter divides an address, which is provided to the signal converting path and conform to the first type memory interface, into a row address, a column address and a bank address which conform to the second type memory interface.

7. A memory device, comprising:
   a memory array;
   a converting unit for converting an address and a control signal which are inputted via a first port and conform to a first type memory interface into an address and a control signal which conform to a second type memory interface and dividing the address, which is inputted via the first port and conforms to the first type memory interface, into a row address, a column address and a bank address which conform to the second type memory interface; and
   a memory interface for performing a read operation or a write operation on the memory array based on the address and the control signal which conform to the second type memory interface.

8. The memory device of claim 7, wherein the converting unit converts the address and the control signal which are inputted via the first port and conform to the first type memory interface into the address and the control signal which conform to the second type memory interface through a signal converting path in response to a selecting signal or bypasses an address and a control signal which are inputted via the first port and conform to the second type memory interface through a bypass path.

9. The memory device of claim 8, wherein the converting unit comprises:
   a first selector for providing the address and the control signal, which are inputted via the first port and conform to the first type memory interface, to the signal converting path or providing an address and a control signal which are inputted via the first port and conform to the second type memory interface to the bypass path;
   a signal converter for converting an address and a control signal, which are provided to the signal converting path and conform to the first type memory interface, into an address and a control signal which conform to the second type memory interface; and
   a second selector for selecting an address and a control signal which are bypassed or an address and a control signal which are outputted from the signal converter and conform to the second type memory interface.

10. The memory device of claim 9, wherein the first type memory interface includes a PSRAM interface, the second type memory interface includes an SDRAM interface, and the signal converter divides an address which is provided to the signal converting path and conform to the first type memory interface into a row address, a column address and a bank address which conform to the second type memory interface.

11. A method of operating a dual port memory device, comprising:

converting an address and a control signal, which are inputted via a first port and conform to a first type memory interface, into an address and a control signal which conform to a second type memory interface;

dividing an address, which is inputted via the first port and conforms to the first type memory interface, into a row address, a column address and a bank address which conform to the second type memory interface; and performing a read operation or a write operation on the memory array based on the address and the control signal which are inputted via a second port and conform to the second type memory interface.

12. The method of claim 11, wherein the converting an address and a control signal, which are inputted via a first port and conform to a first type memory interface, into an address and a control signal which conform to a second type memory interface comprises:

extracting a row address which conform to the second type memory interface from an address which is inputted via the first port and conform to the first type memory interface;

extracting a column address which conform to the second type memory interface from an address which is inputted via the first port and conform to the first type memory interface; and extracting a bank address which conform to the second type memory interface from an address which is inputted via the first port and conform to the first type memory interface.

13. The method of claim 12, wherein the converting an address and a control signal, which are inputted via a first port and conform to a first type memory interface, into an address and a control signal which conform to a second type memory interface comprises:

receiving a control signal which is inputted via the first port and conform to the first type memory interface and generating timing information for performing a read operation, a write operation and a refresh operation which conform to the second type memory interface; and receiving the timing information and generating a control signal which conform to the second type memory interface.

14. The method of claim 11, wherein the converting an address and a control signal, which are inputted via a first port and conform to a first type memory interface, into an address and a control signal which conform to a second type memory interface comprises:

converting the address and the control signal, which are inputted via the first port and conform to the first type memory interface, into an address and a control signal which conform to the second type memory interface through a signal converting path in response to a selecting signal or bypassing an address and a control signal which are inputted via the first port and conform to the second type memory interface through a bypass path;

performing a read operation or a write operation on the memory array based on the converted address and control signal while the selecting signal has a non-active state; and performing a read operation or a write operation on the memory array based on the bypassed address and control signal while the selecting signal has an active state.

15. The method of claim 14, wherein the converting an address and a control signal, which are inputted via the first port and conform to the first type memory interface, into an address and a control signal which conform to the second type memory interface through a signal converting path in response to a selecting signal or bypassing an address and a control signal which are inputted via the first port and conform to the second type memory interface through a bypass path comprises:

bypassing an address and a control signal, which are inputted via the first port and conform to the second type memory interface, through the bypass path when the selecting signal gets active;

converting an address and a control signal, which are inputted via the first port and conform to the second type memory interface, into an address and a control signal which conform to the second type memory interface through a signal converting path when the selecting signal gets non-active;

converting an address and a control signal, which are provided to the signal converting path and conform to the first type memory interface, into an address and a control signal which conform to the second type memory interface; and selecting an address and a control signal which are bypassed or an address and a control signal which are outputted from a signal converter and conform to the second type memory interface.

16. The method of claim 15, wherein the first type memory interface includes a PSRAM interface, the second type memory interface includes an SDRAM interface, and the converting an address and a control signal, which are provided to the signal converting path and conform to the first type memory interface, into an address and a control signal which conform to the second type memory interface comprises dividing an address, which is provided to the signal converting path and conform to the first type memory interface, into a row address, a column address and a bank address which conform to the second type memory interface.

17. The method of claim 16, wherein the converting an address and a control signal, which are provided to the signal converting path and conform to the first type memory interface, into an address and a control signal which conform to the second type memory interface comprises:

extracting a row address, which conform to the second type memory interface, from an address which is inputted to the signal converting path and conform to the first type memory interface;

extracting a column address, which conform to the second type memory interface, from an address which is inputted to the signal converting path and conform to the first type memory interface; and extracting a bank address, which conform to the second type memory interface, from an address which is inputted to the signal converting path and conform to the first type memory interface.

18. The method of claim 17, wherein the converting an address and a control signal, which are provided to the signal converting path and conform to the first type memory interface, into an address and a control signal which conform to the second type memory interface comprises:

receiving a control signal which is inputted to the signal converting path and conform to the first type memory interface and generating timing information for performing a read operation, a write operation and a refresh operation which conform to the second type memory interface; and receiving the timing information and generating a control signal which conform to the second type memory interface.

19. A dual port memory device, comprising:
a memory array;
a dual interface port including a first selector for providing a first path through which the memory array is accessed according to a first type memory interface based on an address and a control signal which are inputted via a first port or a second path through which the memory array is accessed according to a second type memory interface, in response to a selecting signal, an interface for outputting an address for accessing the memory array and data according to the first type memory interface based on an address and a control signal which are provided through the first path or outputting an address for accessing the memory array and data according to the second type memory interface based on an address and a control signal which are provided through the second path and a second selector for selecting any address of an address for accessing the memory array and data according to the first type memory interface and an address for accessing the memory array and data according to the second type memory interface and data in response to the selecting signal for accessing the memory array according to the first type memory interface or the second type memory interface based on the address and the control signal which are inputted via the first port, in response to the selecting signal; and
a first memory interface for accessing the memory array through the second type memory interface based on an address and a control signal which are inputted via a second port.

20. The dual port memory device of claim 19, wherein the interface comprises:
an I/O buffer coupled between the first selector and the second selector and configured to buffer data to access the memory array;
a first type memory interface for buffering data to access the memory array in the I/O buffer according to the first type memory interface based on an address and a control signal which are provided through the first path, and decoding and outputting an address which is provided through the first path; and
a second type memory interface for buffering data to access the memory array in the I/O buffer according to the second type memory interface based on an address and a control signal which are provided through the second path, and decoding and outputting an address which is provided through the second path.

21. A memory device, comprising:
a memory array; and
a dual interface port including a first selector for providing a first path through which a memory array is accessed according to a first type memory interface based on an address and a control signal which are inputted via a first port or a second path through which the memory array is accessed according to a second type memory interface, in response to a selecting signal, an interface for outputting an address for accessing a memory array and data according to the first type memory interface based on an address and a control signal which are provided through the first path or outputting an address for accessing the memory array and data according to the second type memory interface based on an address and a control signal which are provided through the second path and a second selector for selecting any address of an address for accessing the memory array and data according to the first type memory interface and an address for accessing the memory array and data according to the second type memory interface and data in response to the selecting signal for accessing the memory array according to the first type memory interface or the second type memory interface based on the address and the control signal which are inputted via the first port, in response to the selecting signal.

22. A method of operating a dual port memory device, comprising:
accessing a memory array according to a first type memory interface based on an address and a control signal which are inputted via a first port while a selecting signal has a non-active state;
providing a first path through which the memory array is accessed according to the first type memory interface based on an address and a control signal which are inputted via the first port while the selecting signal has the non active state;
accessing a memory array according to a second type memory interface based on an address and a control signal which are inputted via the first port while the selecting signal has an active state; and
providing a second path through which the memory array is accessed according to the second type memory interface while the selecting signal has the active state.

23. The method of claim 22, wherein the accessing a memory array according to a first type memory interface based on an address and a control signal which are inputted via a first port while the selecting signal has a non-active state comprises:
outputting an address for accessing the memory array and data according to the first type memory interface based on an address and a control signal which are provided through the first path.

24. The method of claim 23, wherein the accessing a memory array according to a second type memory interface based on an address and a control signal which are inputted via the first port while the selecting signal has an active state comprises:
outputting an address for accessing the memory array and data according to the second type memory interface based on an address and a control signal which are provided through the second path.

25. The method of claim 24, further comprising selecting any of an address for accessing the memory array according to the first type memory interface and an address for accessing the memory array according to the second type memory interface in response to the selecting signal.

* * * * *